US012784838B2

(12) United States Patent
Heo et al.

(10) Patent No.: US 12,784,838 B2
(45) Date of Patent: Nov. 3, 2026

(54) NONVOLATILE MEMORY DEVICES, STORAGE DEVICES INCLUDING THE SAME, AND METHODS OF OPERATING THE SAME

(71) Applicant: Samsung Electronics Co., Ltd., Suwon-si (KR)

(72) Inventors: Minjeong Heo, Suwon-si (KR); Jaehue Shin, Suwon-si (KR); Daeseok Byeon, Suwon-si (KR); Yongsung Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 304 days.

(21) Appl. No.: 18/509,021

(22) Filed: Nov. 14, 2023

(65) Prior Publication Data

US 2024/0363172 A1 Oct. 31, 2024

(30) Foreign Application Priority Data

Apr. 28, 2023 (KR) ........................ 10-2023-0056334

(51) Int. Cl.
*G11C 16/24* (2006.01)
*G11C 16/04* (2006.01)

(52) U.S. Cl.
CPC .......... *G11C 16/24* (2013.01); *G11C 16/0483* (2013.01)

(58) Field of Classification Search
CPC ......... G11C 7/1051; G11C 7/078; G11C 7/22; G11C 7/106; G11C 7/1057; G11C 16/24; G11C 16/0483; G11C 16/10; G11C 16/26; G11C 29/4401; G11C 7/1084; G11C 7/1087; G11C 7/12; G11C 29/42; G11C 2216/14
USPC ..................................................... 365/189.05
See application file for complete search history.

(56) References Cited

U.S. PATENT DOCUMENTS

| | | | | |
|---|---|---|---|---|
| 7,679,133 | B2 | 3/2010 | Son et al. | |
| 8,553,466 | B2 | 10/2013 | Han et al. | |
| 8,559,235 | B2 | 10/2013 | Nam et al. | |
| 8,654,587 | B2 | 2/2014 | Yoon et al. | |
| 9,536,970 | B2 | 1/2017 | Seol et al. | |
| 10,720,207 | B2 * | 7/2020 | Cho | G11C 16/0483 |
| 10,910,080 | B2 * | 2/2021 | Bang | G06F 3/0688 |

(Continued)

FOREIGN PATENT DOCUMENTS

| | | | |
|---|---|---|---|
| JP | 2000251484 | A | 9/2000 |
| JP | 2001325796 | A | 11/2001 |

(Continued)

*Primary Examiner* — Uyen Smet
*Assistant Examiner* — Christopher Lane Reece
(74) *Attorney, Agent, or Firm* — Wolf, Greenfield & Sacks, P.C.

(57) ABSTRACT

A nonvolatile memory device includes a plurality of tri-state latches, a sensing node circuit configured to electrically couple a sensing node therein to a bitline of the memory device, a transfer node circuit configured to electrically couple a transfer node therein to the plurality of tri-state latches, and a node connection circuit configured to electrically connect the transfer node to the sensing node. In addition, the transfer node circuit and the node connection circuit are collectively configured to simultaneously reflect data stored in at least two of the plurality of tri-state latches to the sensing node, in response to a dump sequence operation.

20 Claims, 25 Drawing Sheets

(56) References Cited

U.S. PATENT DOCUMENTS

| | | | | |
|---|---|---|---|---|
| 2006/0245247 | A1 | 11/2006 | Yano et al. | |
| 2008/0192560 | A1 | 8/2008 | Lee et al. | |
| 2010/0214849 | A1 | 8/2010 | Jin et al. | |
| 2012/0182798 | A1 | 7/2012 | Hosono et al. | |
| 2014/0355334 | A1* | 12/2014 | Gotterba | G11C 7/1051 365/207 |
| 2017/0140823 | A1* | 5/2017 | Missiroli | G11C 16/26 |
| 2017/0256309 | A1 | 9/2017 | Yoon | |
| 2022/0051714 | A1* | 2/2022 | Bang | G11C 16/3418 |
| 2022/0246216 | A1 | 8/2022 | Lee et al. | |

FOREIGN PATENT DOCUMENTS

| | | | |
|---|---|---|---|
| JP | 2008198343 | A | 8/2008 |
| JP | 4896011 | B2 | 1/2012 |
| KR | 101003935 | B1 | 12/2010 |
| KR | 20170102659 | A | 9/2017 |

* cited by examiner

NONVOLATILE MEMORY DEVICES, STORAGE DEVICES INCLUDING THE SAME, AND METHODS OF OPERATING THE SAME

REFERENCE TO PRIORITY APPLICATION

This application claims priority to Korean Patent Application No. 10-2023-0056334, filed Apr. 28, 2023, the disclosure of which is hereby incorporated herein by reference.

BACKGROUND

Example embodiments relate to integrated circuit devices and, more particularly, to nonvolatile memory devices, storage devices including nonvolatile memory devices and methods of operating the same.

Generally, a storage device including a non-volatile memory device has been widely used in universal serial bus (USB) drive systems, digital cameras, mobile phones, smart phones, tablets, PCs, memory cards, solid state drives (SSD), and the like. A storage device may be used advantageously to store or move a large amount of data.

SUMMARY

An example embodiment of the present invention is to provide: a nonvolatile memory device having a page buffer therein, which includes a sensing node and a transfer node that are isolated from each other, a storage device including the nonvolatile memory device, and a method of operating the nonvolatile memory device.

According to an example embodiment of the present invention, a nonvolatile memory device includes a plurality of tri-state latches, a sensing node circuit having a sensing node connected to a bitline, a transfer node circuit having a transfer node connected to the plurality of tri-state latches, and a node connection circuit, which electrically connects the sensing node to the transfer node. According to some embodiments, the transfer node circuit and the node connection circuit are collectively configured to simultaneously reflect data stored in at least two of the plurality of tri-state latches to the sensing node, in response to a dump sequence operation.

According to another example embodiment of the present invention, a method of operating a nonvolatile memory device includes precharging a sensing node and a transfer node, simultaneously reflecting data of a first latch and data of a second latch to the sensing node, precharging the transfer node, and sensing data corresponding to the sensing node. In some of these embodiments, each of the first latch and the second latch includes a tri-state latch. In addition, when data of the first latch and/or the second latch is damaged, the data may be restored using inversion data of the tri-state latch.

According to a further embodiment in the present invention, a storage device includes a nonvolatile memory package having a plurality of nonvolatile memory devices therein. A controller is also provided, which is configured to control the nonvolatile memory package. Each of the plurality of nonvolatile memory devices may include: a memory cell array having a plurality of memory cells connected between wordlines and bitlines, a row decoder configured to select one of the wordlines, and page buffers connected to the bitlines. In addition, each of the page buffers may include a plurality of latches, a sensing node circuit having a sensing node connected to the bitline, a transfer node circuit having a transfer node connected to the plurality of latches, and a node connection circuit, which electrically connects the sensing node to the transfer node. Advantageously, each of the page buffers is configured to perform a dump sequence operation, which includes simultaneously reflecting data stored in at least two of the plurality of latches to the sensing node during a program operation.

According to an additional embodiment in the present invention, a nonvolatile memory device includes: a memory cell array having a plurality of memory cells connected between a plurality of wordlines and a plurality of bitlines, a row decoder configured to select one of the plurality of wordlines, a page buffer circuit having a plurality of page buffers connected to the plurality of bitlines, an input/output buffer configured to input and output data stored in the plurality of page buffers, a voltage generator configured to generate voltages applied to the selected wordline and non-selected wordline, and control logic, which is configured to control the row decoder, the row decoder, the page buffer circuit, the input/output buffer, and the voltage generator. In addition, each of a plurality of page buffers includes a sensing node connected to one of the plurality of bitlines, a transfer node connected to a plurality of latches configured to perform tri-state control, and a calibration transistor connecting the sensing node to the transfer node.

According to a still further embodiment of the present invention, a nonvolatile memory device includes a plurality of page buffers connected to a plurality of bitlines, and a page buffer controller configured to control each of the plurality of page buffers. In some of these embodiments, each of the plurality of page buffers includes: a plurality of latches connected to a transfer node through a switching operation, and a node connection circuit connecting the transfer node to a sensing node connected to one bitline among the plurality of bitlines. Each of the plurality of latches may be configured as a tri-state latch. The page buffer controller may also be configured to restore damaged data generated during a dump operation by performing a tri-state latch operation.

BRIEF DESCRIPTION OF DRAWINGS

The above and other aspects, features, and advantages in the example embodiment will be more clearly understood from the following detailed description, taken in combination with the accompanying drawings, in which.

DETAILED DESCRIPTION

Hereinafter, example embodiments will be described as below with reference to the accompanying drawings.

A nonvolatile memory device according to an example embodiment, a storage device having the same, and a method of operating the same may discharge the voltage of a sensing node to a latch's ground terminal by connecting the sensing node to a transfer node using a calibration transistor. In this exemplary embodiment, a dump sequence operation is performed, which simultaneously reflects the values of first and second latches in a page buffer to the sensing node. During this dump sequence operation, damaged data may be restored using a tri-state latch. For instance, data may be restored in a unit of time by sequentially activating tri-state transistors included in the tri-state latch. In another embodiment, the sensing nodes may be discharged collectively, regardless of the number of latches, using the calibration transistor and a tri-state P-channel metal oxide semiconductor (PMOS) transistor.

Figure 1:
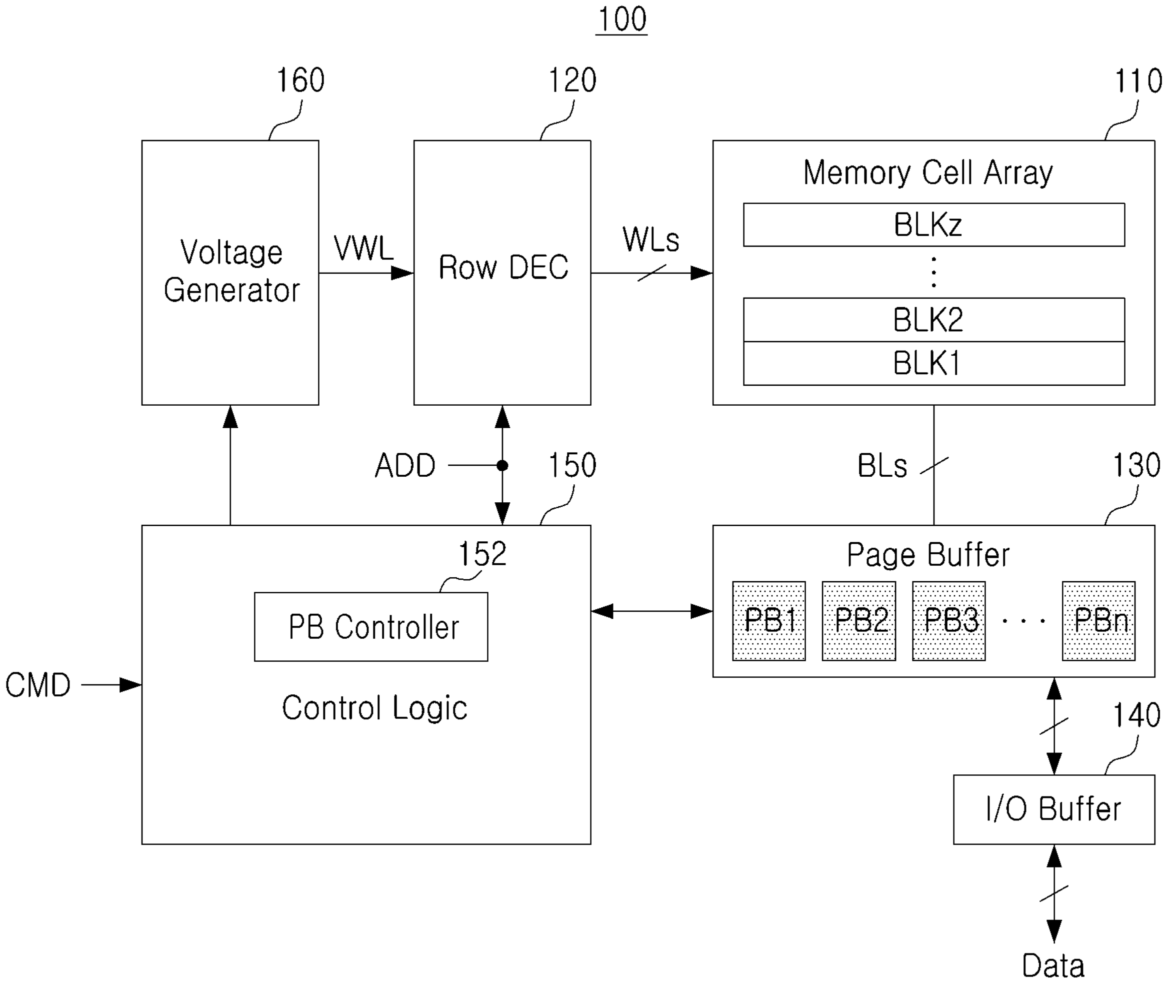
FIG. 1 is a diagram illustrating a nonvolatile memory device according to an example embodiment of the present disclosure.

FIG. 1 is a diagram illustrating a nonvolatile memory device 100 according to an example embodiment. Referring to FIG. 1, a nonvolatile memory device 100 may include a memory cell array 110, a row decoder 120, a page buffer circuit 130, an input/output buffer 140, control logic 150, and a voltage generator 160. The memory cell array 110 may be connected to the row decoder 120 through wordlines WLs or selection lines SSL and GSL (i.e., string selection lines, ground selection lines). The memory cell array 110 may be connected to the page buffer circuit 130 through bitlines BLs. The memory cell array 110 may include a plurality of cell strings. Each channel of cell strings may be formed in a vertical or horizontal direction. Each of the cell strings may include a plurality of memory cells. Here, the plurality of memory cells may be programmed, erased, or read by a voltage provided through bitline BLs or wordline WLs. Generally, a program operation may be performed in a page unit, and an erase operation may be performed in a block unit. Details of the memory cell will be described in U.S. registered patents U.S. Pat. Nos. 7,679,133, 8,553,466, 8,654,587, 8,559,235, and 9,536,970. In an example embodiment, the memory cell array 130 may include a three-dimensional memory cell array, and the 3D (three-dimensional) memory cell array may include a plurality of NAND strings disposed in a row direction and a column direction.

The row decoder 120 may be implemented to select one of memory blocks BLK1 to BLKz (z is a positive integer greater than one) of the memory cell array 110 in response to an address ADD. The row decoder 120 may transmit the wordline voltage VWL corresponding to the operation mode to the wordline of the selected memory block. During a program operation, the row decoder 120 may apply a program voltage and verification voltage to a selected wordline, and may apply a pass voltage to a non-selected wordline. During a read operation, the row decoder 120 may apply a read voltage to a selected wordline and a read pass voltage to a non-selected wordline.

The page buffer circuit 130 may be implemented to operate as a write driver or a sense amplifier. During program operation, the page buffer circuit 130 may apply a bitline voltage corresponding to data to be programmed to bitlines of the memory cell array 110. During a read operation or a verification read operation, the page buffer circuit 130 may sense data stored in the selected memory cell through the bitline BL. Each of a plurality of page buffers PB1 to PBn (n is a positive integer greater than one) included in the page buffer circuit 130 may be connected to at least one bitline.

Each of the plurality of page buffers PB1 to PBn may be implemented such that a sensing node and a transfer node may be isolated from each other. Each of the plurality of page buffers PB1 to PBn may include a plurality of tri-state latches. Among the plurality of latches, the values stored in the first latch and the second latch may be simultaneously reflected to the sensing node through the dump sequence operation. For example, when at least one of the latches is in a high-level state, the sensing node may be discharged according to the latch value of the inversion data node. During this dump sequence operation, damaged data may be advantageously restored using a tri-state latch.

The input/output buffer 140 may provide data provided from an external entity to the page buffer circuit 130. The input/output buffer 140 may provide a command CMD from an external entity to the control logic 150. The input/output buffer 140 may provide an address ADD from an external entity to the control logic 150 or the row decoder 120. Also, the input/output buffer 140 may output data sensed and latched by the page buffer circuit 130 to an external entity.

The control logic 150 may be implemented to control the row decoder 120, the page buffer circuit 130, and the voltage generator 160 in response to a command CMD or a control signal transferred from an external device. Also, the control logic 150 may be implemented to perform a dynamic read operation based on cell count. In addition, the control logic 150 may be implemented to generate a virtual cell driving voltage Vvcp in a virtual cell mode. In an example embodiment, the virtual cell driving voltage Vvcp may be generated using a current mirror. Here, the current mirror may be implemented to receive a current from a pad connected to an external device in a virtual cell mode. In some embodiments, the control logic 150 may further include a page buffer controller 152 for controlling the page buffer circuit 130, as shown. The page buffer controller 152 may control each of the page buffers PB1 to PBn based on different timing. Advantageously, the page buffer controller 152 may control the page buffers PB1 to PBn to perform a tri-state latch operation.

The voltage generator 160 may be implemented to generate various types of wordline voltages to be applied to each wordline under control of the control logic 150 and well voltages to be supplied to a bulk region/substrate (e.g., a well region) in which memory cells are formed. Wordline voltages applied to each wordline may include a program voltage, a pass voltage, a read voltage, read pass voltages, and the like. Although not illustrated, the nonvolatile memory device 100 in the example embodiment may include a cell counter. The cell counter may be implemented to count memory cells corresponding to a specific threshold voltage range from data sensed by the page buffer circuit 130. For example, the cell counter may count the number of memory cells having a threshold voltage of a specific threshold voltage range by processing data detected in each of the plurality of page buffers PB1 to PBn.

A general nonvolatile memory device performs a sequential logical AND operation to restore damaged data during a programming operation, using a dump sequence operation. However, this can lead to overhead in the programming operation due to an increase in the dump sequence. In contrast, the nonvolatile memory device 100 in the exemplary embodiment may execute the dump sequence operation all at once, regardless of the number of latches involved in the programming operation. Furthermore, it may restore damaged data within a specific time unit during the dump sequence operation, by employing a tri-state latch(es).

Figure 2:
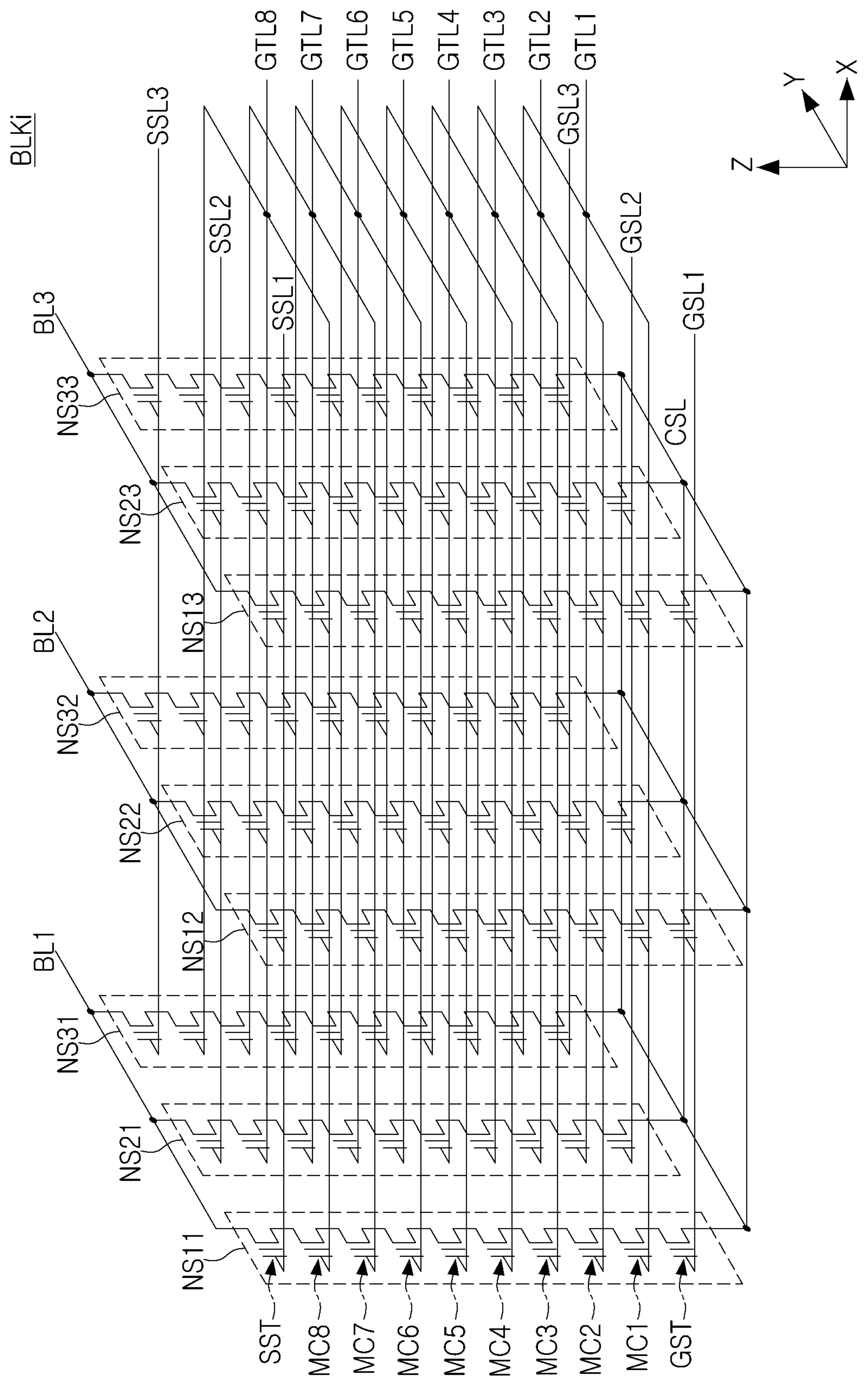
FIG. 2 is a circuit diagram illustrating a memory block according to an example embodiment of the present disclosure.

FIG. 2 is a circuit diagram illustrating a memory block BLKi (where i is a positive integer greater than one) according to an example embodiment. A plurality of NAND strings included in the memory block BLKi may be formed in a direction perpendicular to the substrate. Referring to FIG. 2, the memory block (BLKi) may include multiple NAND strings (NS11~NS33) connected between the bitlines (BL1, BL2, BL3) and a common source line (CSL). Each of the multiple NAND strings (NS11~NS33) can include a string select transistor (SST), multiple memory cells (MC1, MC2, . . . , MC8), and a ground select transistor (GST). In FIG. 2, each of the multiple NAND strings (NS11~NS33) is shown with eight memory cells (MC1, MC2, . . . , MC8). However, it should be understood that the number of memory cells in the present invention is not limited to this.

The string selection transistor SST may be connected to corresponding string selection lines SSL1, SSL2, and SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to wordlines, and a portion of gate lines GTL1, GTL2, . . . , GTL8 may correspond to dummy wordlines. The ground selection transistor GST may be connected to corresponding ground selection lines GSL1, GSL2 and GSL3. The string selection transistor SST may be connected to corresponding bitlines BL1, BL2, and BL3, and the ground selection transistor GST may be connected to the common source line CSL.

Wordlines (e.g., WL) on the same height may be commonly connected, and the ground selection lines GSL1, GSL2, and GSL3 and string selection lines SSL1, SSL2, and SSL3 may be isolated from each other, respectively. The memory block BLKi illustrated in FIG. 2 may be connected to 8 gate lines GTL1, GTL2, . . . , GTL8 and three bitlines BL1, BL2, and BL3, it should be understood that an embodiment thereof is not limited thereto.

Figure 3:
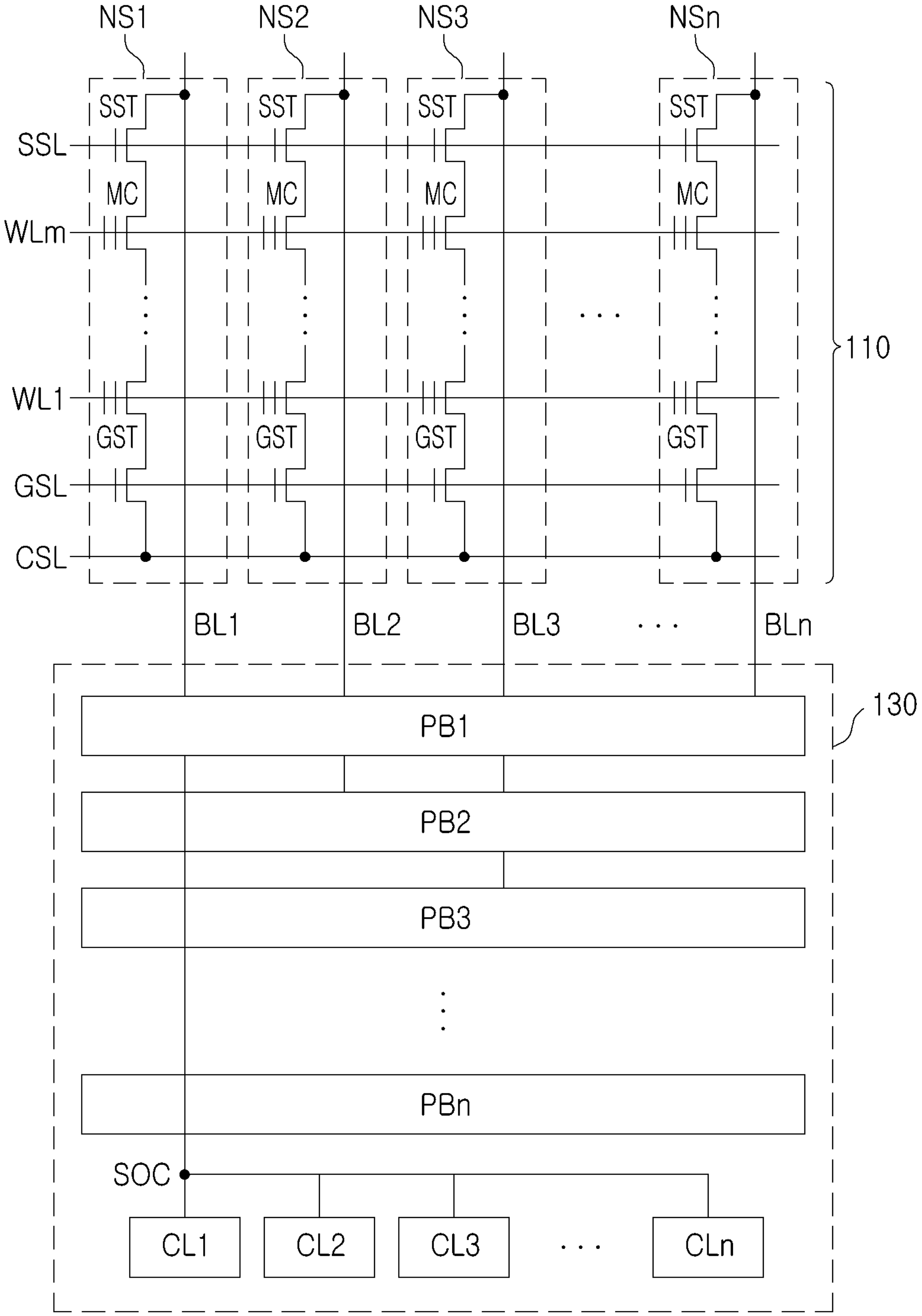
FIG. 3 is a diagram illustrating connection relationship between a memory cell array and a page buffer circuit according to an example embodiment of the present disclosure.

FIG. 3 is a diagram illustrating a connection relationship between a memory cell array 110 and a page buffer circuit 120 according to an example embodiment. Referring to FIG. 3, the memory cell array 110 may include first to nth NAND strings NS1 to NSn (where n is a positive integer greater than one). Each of the first to nth NAND strings NS1 to NSn may include ground selection transistor GST connected to ground selection line GSL, multiple memory cells MC each connected to a plurality of wordlines WL1 to WLm (m is a positive integer greater than one), and string selection transistor SST connected to string selection line SSL, and a ground selection transistor GST, a plurality of memory cells MC and a string selection transistor SST may be connected to each other in series.

The page buffer circuit 130 may include the first to nth page buffers PB1 to PBn. The first page buffer PB1 may be connected to the first NAND string NS1 through the first bitline BL1, and the nth page buffer PBn may be connected to the nth NAND string NSn through the nth bitline BLn. For example, n may be 7, and the page buffer circuit 130 may have a structure in which 8-stage page buffers PB1 to PBn are disposed in a row. For example, the first to nth page buffers PB1 to PBn may be disposed in a row in an extension direction of the first to nth bitlines BL1 to BLn.

The page buffer circuit 130 may further include first to nth cache latches CL1 to CLn corresponding to the first to nth page buffers PB1 to PBn, respectively. The page buffer circuit 130 may have a structure in which eight-stage cache latches CL1 to CLn are disposed in a row. For example, the first to nth cache latches CL1 to CLn may be disposed in a row in an extension direction of first to nth bitlines BL1 to BLn. Each sensing node of the first to nth page buffers PB1 to PBn may be connected in common to the combined sensing node SOC. Also, the first to nth cache latches CL1 to CLn may be commonly connected to the combined sensing node SOC. Accordingly, the first to nth page buffers PB1 to PBn may be connected to the first to nth cache latches CL1 to CLn through the combined sensing node SOC.

Figure 4:
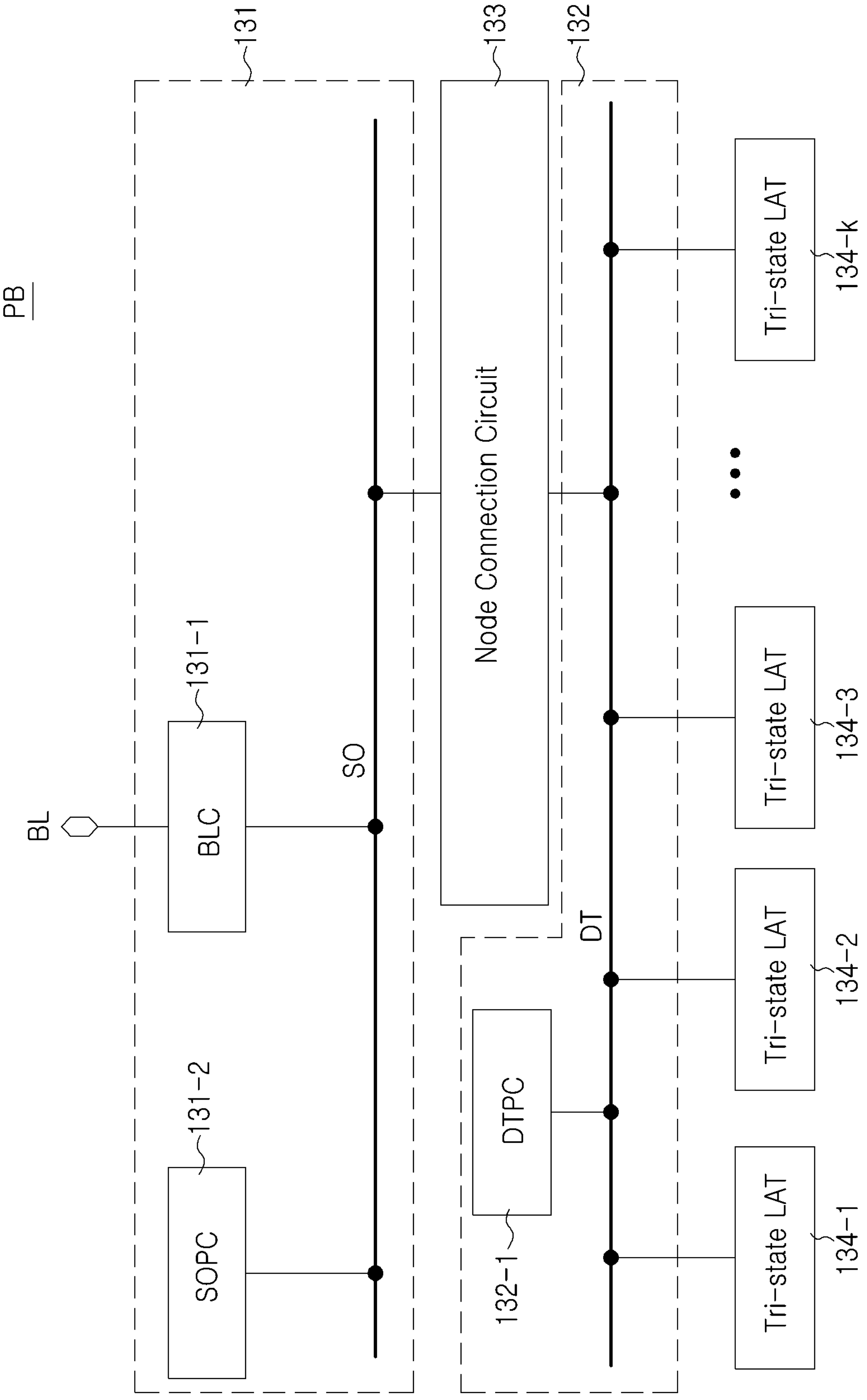
FIG. 4 is a diagram illustrating a page buffer according to an example embodiment of the present disclosure.

FIG. 4 is a diagram illustrating a page buffer PB according to an example embodiment. Referring to FIG. 4, the page buffer PB may include a sensing node circuit 131, a transfer node circuit 132, a node connection circuit 133, and a plurality of latches 134-1, . . . , 134-*k* (k is a positive integer greater than one). The sensing node circuit 131 may sense a voltage level of the bitline BL corresponding to data stored in the memory cell or may connect the sensing node SO to the bitline BL to transmit the voltage level corresponding to the write data to the bitline BL. The sensing node circuit 131 may include a sensing node SO, a bitline connection circuit (BLC) 131-1, and a sensing node precharge circuit (SOPC) 131-2. The bitline connection circuit 131-1 may connect the bitline BL to the sensing node SO.

In particular, the sensing node precharge circuit 131-2 may be implemented to charge the sensing node SO to a specific level. Although not illustrated, the sensing node circuit 131 may further include a circuit for discharging a voltage of the bitline BL to a ground terminal. The transfer node circuit 132 may include a transfer node DT and a transfer node precharge circuit 132-1 (DTPC). The transfer node precharge circuit 132-1 may be implemented to charge the transfer node DT to a specific level. In an example embodiment, the transfer node circuit 132 may further include a ground terminal discharge circuit. The node connection circuit 133 may be implemented to connect the sensing node SO to the transfer node DT to transfer the voltage level of sensing node SO to transfer node DT or to transfer the voltage level of transfer node DT to sensing node SO.

A plurality of latches 134-1, . . . , 134-*k* (k is a positive integer greater than one) may be connected to the transfer node DT. Each of the plurality of latches 134-1, . . . , each of the 134-*k* may include a tri-state latch. Generally, a tri-state latch may indicate one of logic state “0,” logic state “1,” and a disconnected state (e.g., high impedance output state) that is not a “1” or “0” logic state but is an electrical “floating” state. The tri-state latch in an example embodiment may be implemented with interdigitated tri-state inverters between the data node and the inversion data node.

In the general page buffer structure in which the sensing node and the transfer node are isolated, the transfer node may be precharged each time (dump operation) by reflecting only one latch data to the sensing node at a time. This dump sequence operation may be overhead for a program operation. Differently from the example above, the page buffer PB in the example embodiment may perform a dump sequence operation of reflecting a plurality of latch data to the sensing node SO at once without precharging the transfer node DT each time. Also, the page buffer PB in the example embodiment may restore damaged data in this dump sequence operation through a tri-state latch operation. For example, when the sensing node SO of the page buffer PB is discharged through at least one latch, the data of the inversion data node and inversion data node of the tri-state latch used for the discharge pass may be damaged. In this case, the page buffer PB may restore data using a tri-state latch operation. This is because even when the data of the inversion data node of the tri-state latch is damaged, the data of the data node of the tri-state latch may nonetheless be in an intact state.

Figure 5:
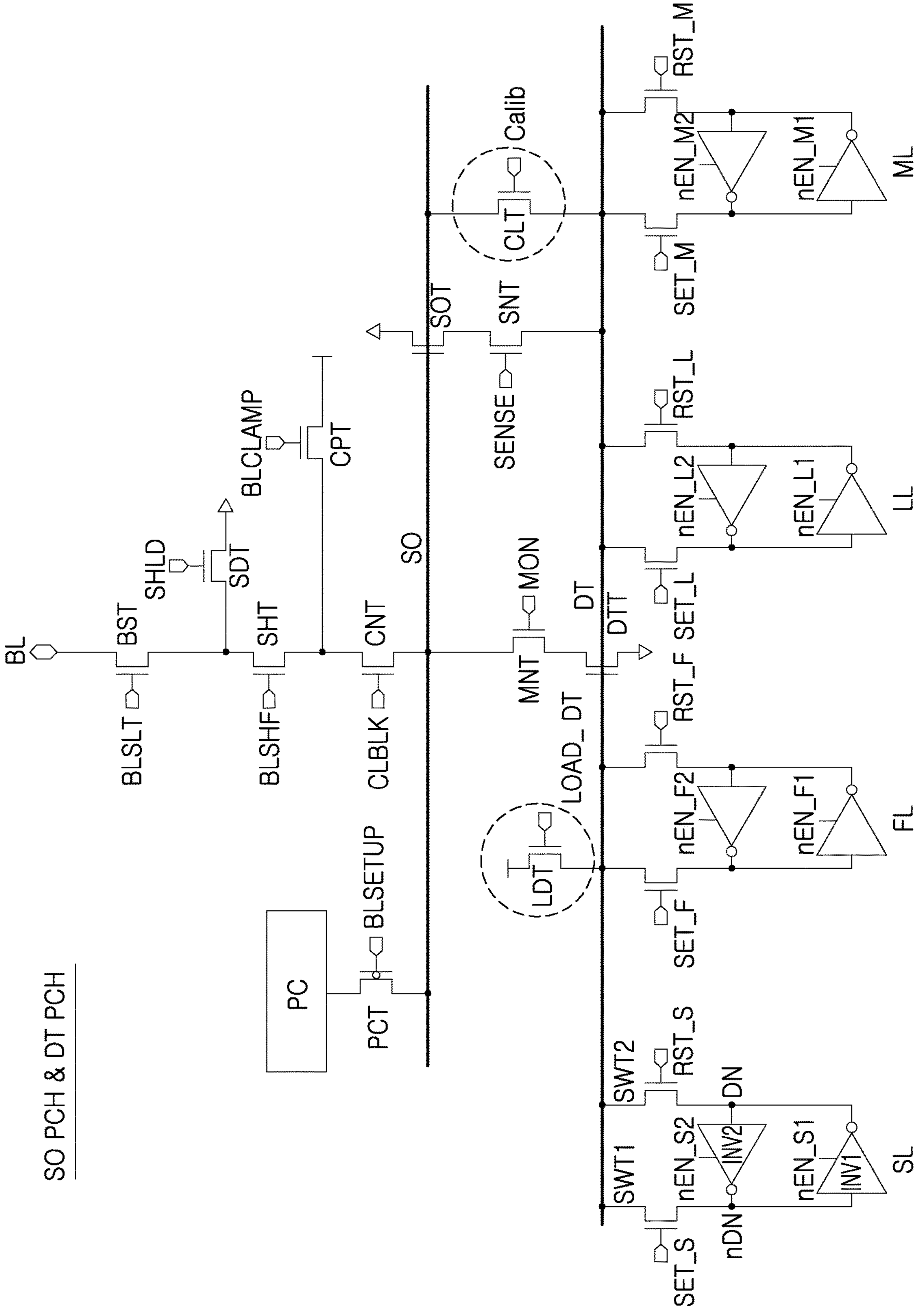
FIGS. 5 to 8 are diagrams illustrating a process of restoring data in a page buffer according to an example embodiment of the present disclosure.

FIGS. 5 to 8 are diagrams illustrating a process of restoring data in a page buffer according to an example embodiment. For ease of description, four latches S, F, L, and M may be connected to transfer node DT, “1” may be stored in a L latch LL (low-order bit latch), and “0” may be stored in a M latch ML (upper-order bit latch). As illustrated in FIG. 5, the sensing node circuit 131 of the page buffer PB may include a sensing node SO, a sensing node transistor SOT, a bitline selection transistor BST, a bitline shut-off transistor SHT, a bitline shield transistor SDT, and a bitline clamp transistor CPT, a bitline connection transistor CNT, and a precharge transistor PCT. The sensing node transistor SOT may include a gate connected to the sensing node SO. The sensing node transistor SOT may be connected between the ground terminal and the sense transistor SNT. The bitline selection transistor BST may be connected to the bitline BL in response to the bitline selection signal BLSLT. The bitline shut-off transistor SHT may be connected to the bitline selection transistor BST in response to the bitline shut-off control signal BLSHF. The bitline shield transistor SDT may connect the bitline selection transistor BST to the ground terminal in response to the bitline shield control signal BHLD. That is, the bitline shield transistor SDT may discharge the voltage of the bitline BL. The bitline clamp transistor CPT may connect the bitline shut-off transistor SHT to power terminal in response to the bitline clamp control signal BLCLAMP. The bitline connection transistor CNT may connect the bitline shut-off transistor SHT to the sensing node SO in response to the bitline connection control signal CLBLK. The precharge transistor PCT may charge the sensing node SO by connecting the precharge circuit PC to the sensing node SO in response to the bitline setup signal BLSETUP. Here, the precharge transistor PCT may include a PMOS transistor.

As illustrated in FIG. 5, the transfer node circuit 132 of the page buffer PB may include a transfer node DT, a transfer node transistor DTT, and a load transistor LDT. The transfer node transistor DTT may include a gate coupled to the transfer node DT. The transfer node transistor DTT may be connected between the monitor transistor MNT and the ground terminal.

The node connection circuit 133 of the page buffer PB may include a monitor transistor MNT, a sense transistor SNT, and a calibration transistor CLT. The monitor transistor MNT may connect the drain of the sensing node SO to the transfer node transistor DTT in response to the monitor signal MON to monitor the sensing node SO. The sense transistor SNT may connect the drain of the transfer node DT to the sensing node transistor SOT in response to the sense signal SENSE to sense the transfer node DT. The calibration transistor CLT may connect the sensing node SO to the transfer node DT for a dump sequence operation.

The tri-state latches SL, FL, LL, and ML of the page buffer PB may be connected to the transfer node DT. The tri-state latch SL may include a first switch transistor SWT1, a second switch transistor SWT2, a first inverter INV1, and a second inverter INV2. The first switch transistor SWT1 may connect the transfer node DT to the inversion data node NDN in response to the set signal SET_S. The second switch transistor SWT2 may connect the transfer node DT to the data node DN in response to a reset signal RST_S. The first inverter INV1 may be activated in response to a first inverter activation signal NEN_S1, and may be connected between the inversion data node NDN and the data node DN. The second inverter INV2 may be activated in response to the second inverter activation signal NEN_S2, and may be connected between the data node DN and the inversion data node NDN. The other latches FL, LL, and ML may also be implemented in the same manner as the aforementioned latch SL.

In FIG. 5, a state in which the transfer node DT and the sensing node SO are precharged is illustrated. As the load transistor LDT is turned on in response to the load signal LOAD_DT, the transfer node DT may be precharged. As the calibration transistor CLT connects the transfer node DT to the sensing node SO in response to the calibration signal Calib, the sensing node SO may be precharged.

Figure 6:
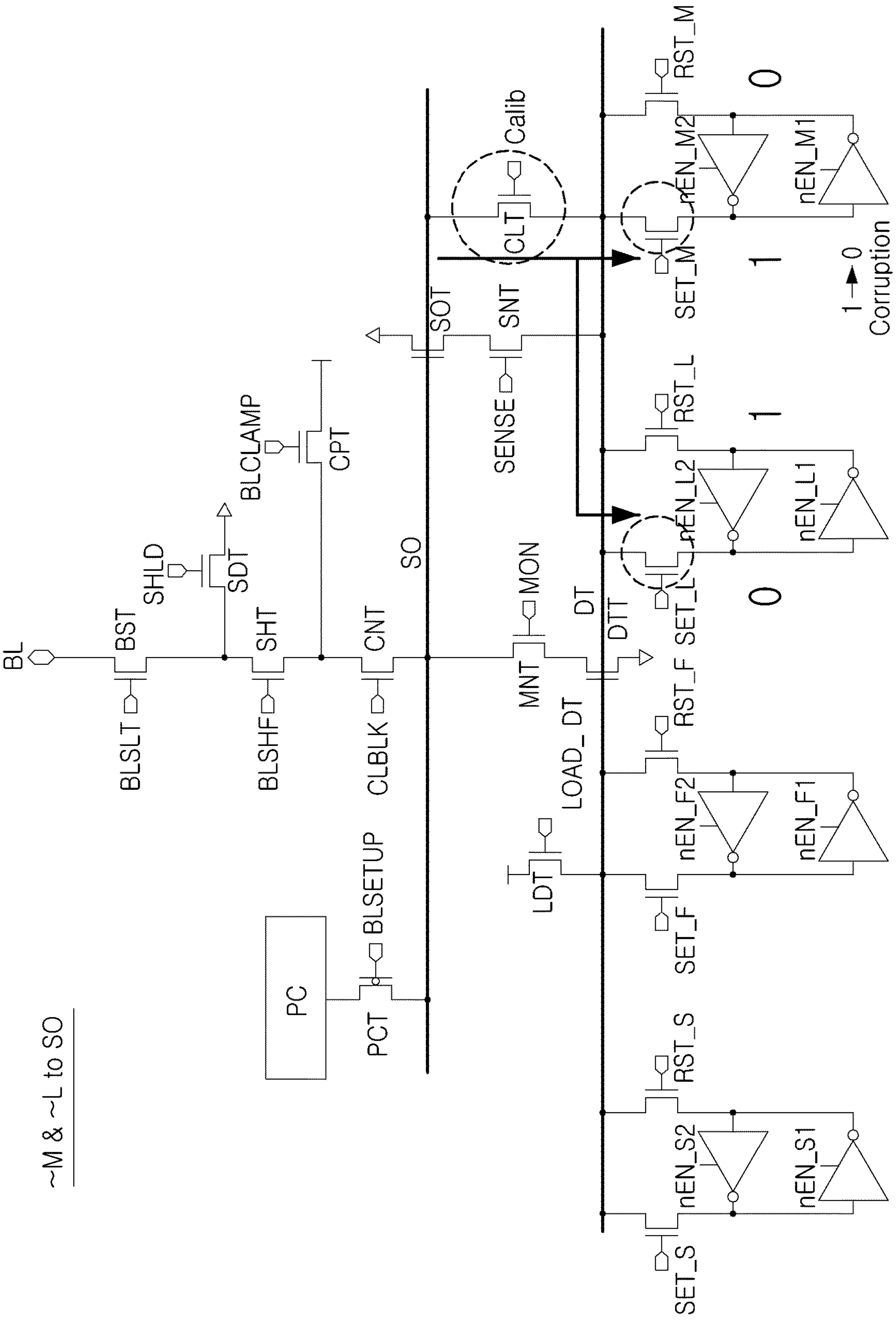

In FIG. 6, a state in which the inversion data “0” of the L latch LL and the inversion data “1” of the M latch ML are reflected in the sensing node SO is illustrated. The set switch corresponding to a L latch LL and the set switch corresponding to a M latch ML may be turned on. In this case, the voltage level of the inversion data “0” of the L latch LL may be reflected to the transfer node DT. Simultaneously, the inversion data “1” of the M latch ML may be damaged (e.g., changed to data “0”) according to the voltage of the transfer node DT. As the calibration transistor CLT connects the transfer node DT to the sensing node SO in response to the calibration signal Calib, a level of the transfer node DT may be reflected to the sensing node SO.

Figure 7:
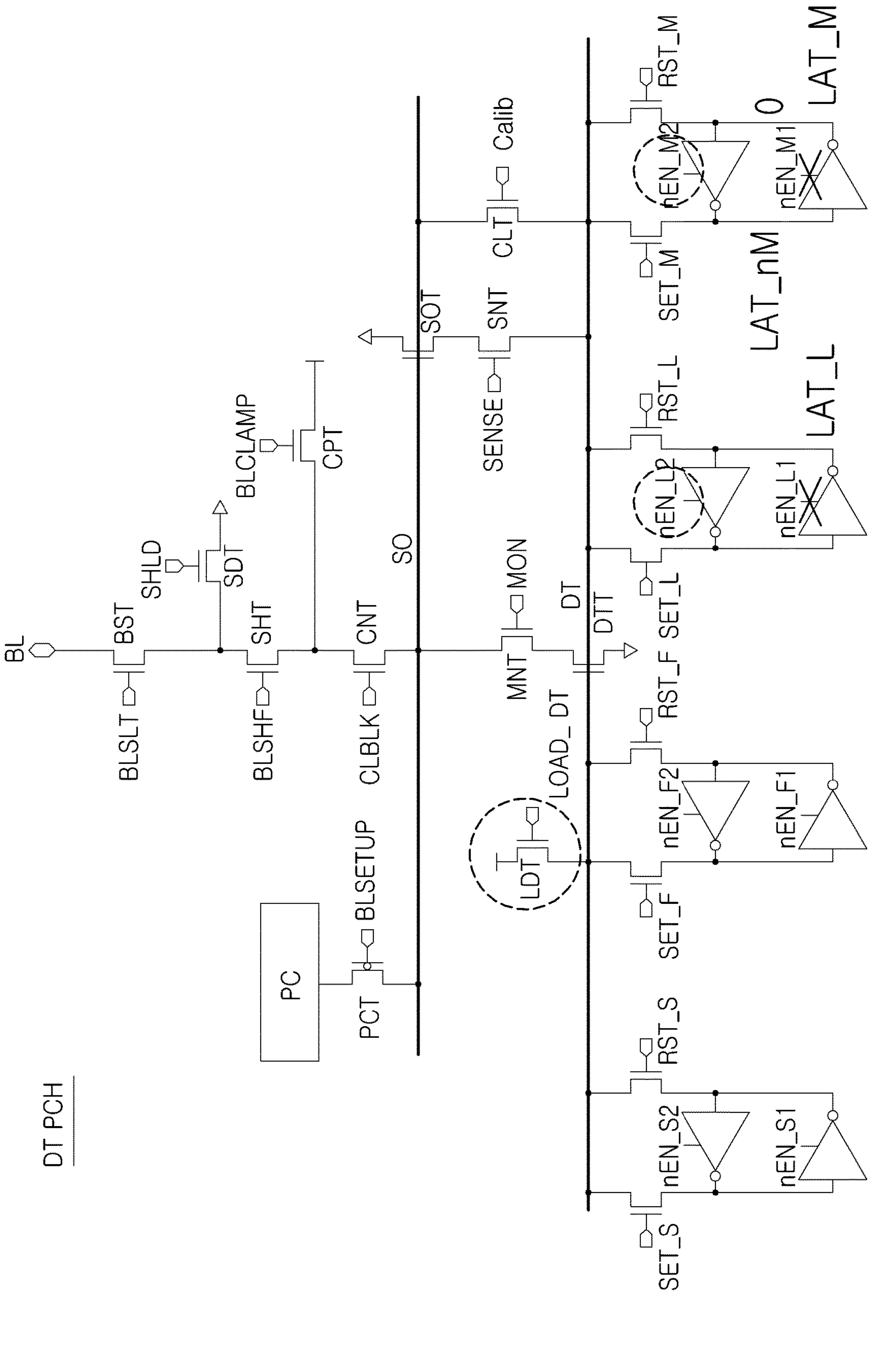

Referring to FIG. 7, a state in which the transfer node DT is precharged is illustrated. As the load transistor LDT is turned on in response to the load signal LOAD_DT, the transfer node DT may be precharged. Simultaneously, second inverters corresponding to data LAT_L and LAT_M of L latch LL and M latch ML may be activated, and first inverters corresponding to inversion data LAT_nL and LAT_mL of L latch LL and M latch ML may be inactivated, the inversion data of L latch LL and the inversion data of M latch ML may be restored. In this case, the damaged inversion data of M latch ML may be restored. When this occurs, the second inverters corresponding to the inversion data of L latch LL and M latch ML may be inactivated.

Figure 8:
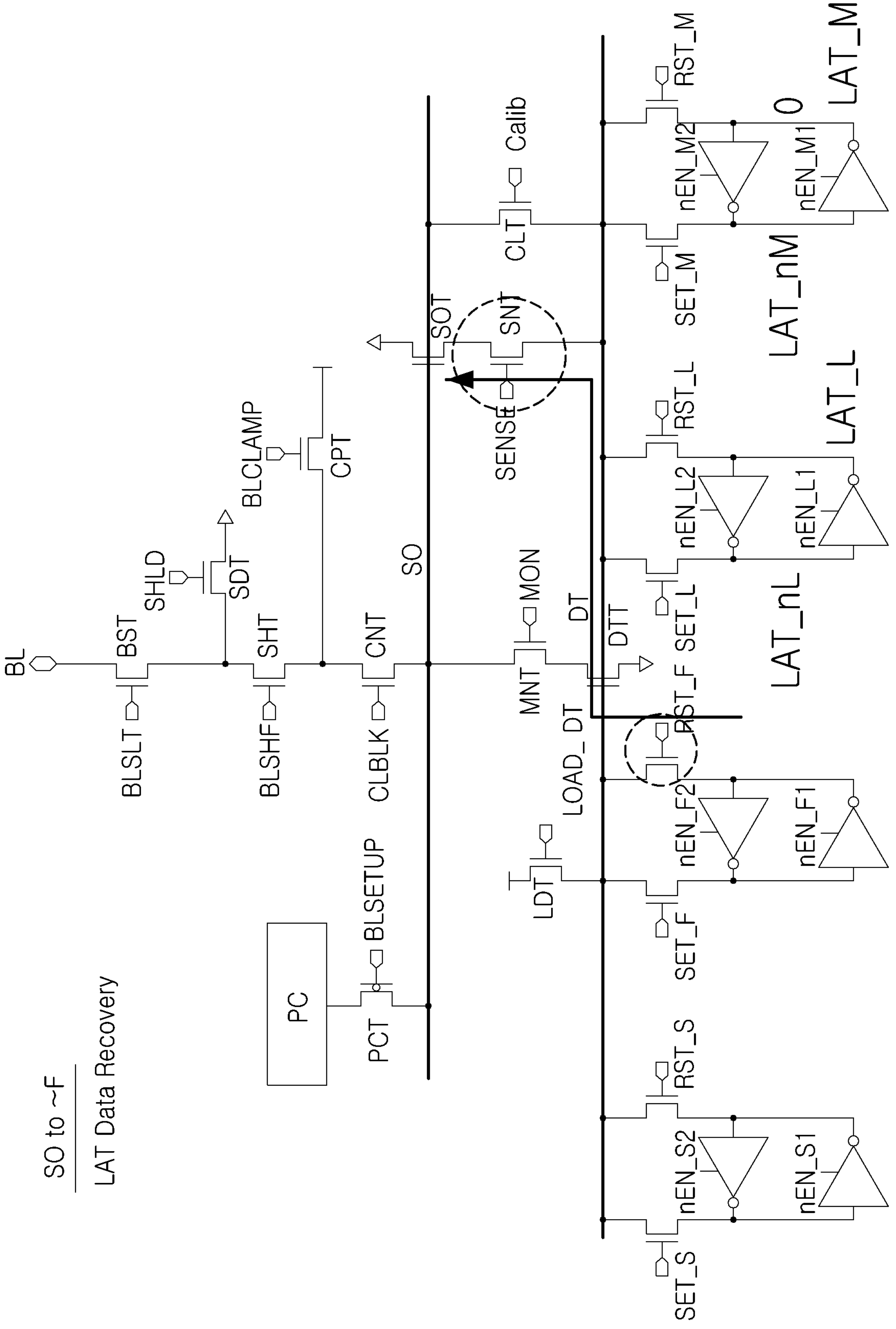

Referring to FIG. 8, a state in which the voltage level of the sensing node SO is transferred to the inversion data of the F latch FL (force latch) and simultaneously the data of the damaged M latch ML is restored is illustrated. The sense transistor SNT may transfer the voltage level of the sensing node S to the transfer node DT by being turned on in response to the sense signal SENSE. As the reset switch of F latch FL is turned on, discharging through F latch FL may be performed. That is, the sensing node SO level (High/Low) may be determined through the dump operation. The turning on/off of the sensing node transistor SOT in FIG. 5 may be determined according to the voltage level of the sensing node SO. As the reset control signal RST_F corresponding to the F latch FL is on a high-level and the sense transistor SENSE is turned on, discharging may be performed. For example, when the voltage level of the sensing node SO is "high-level," the sensing node transistor SOT may be turned on. Accordingly, when the reset signal RST_F is on a high-level and the sense transistor SENSE is turned on, a discharge pass may be formed to the ground terminal connected to the source of the sensing node transistor SOT. In this case, regardless of the value of F latch FL, the value of F latch FL may become data "0" due to this discharge pass (SO to F operation in FIG. 8).

When the voltage level of the sensing node SO is a "low-level", the sensing node transistor SOR may be turned off. Accordingly, even when the reset signal RST_F is on a high-level and the sense transistor SENSE is turned on, since the sensing node transistor SOT is off, no discharge pass may be formed to the ground terminal connected to the source of the sensing node transistor SOT. That is, even when the reset signal RST_F is on a high-level and the sense transistor SENSE is turned on, the F latch FL may be only connected to the transfer node DT. In an example embodiment, when the value of F latch FL is "0," since the transfer node DT is in the precharge state illustrated in FIG. 7, discharging to the ground terminal of F latch FL may be performed when the reset signal RST_F of F latch FL becomes "high-level." In this case, the value of F latch FL may be maintained as "0." In another example embodiment, when the value of F latch FL is "1," since the transfer node DT is in a precharged state in FIG. 7, when the reset signal RST_F becomes "high-level," both F latch FL and transfer node DT may be "high-level" state such that no operation may be performed. Accordingly, the value of F latch FL may be maintained as "1."

Figure 9A:
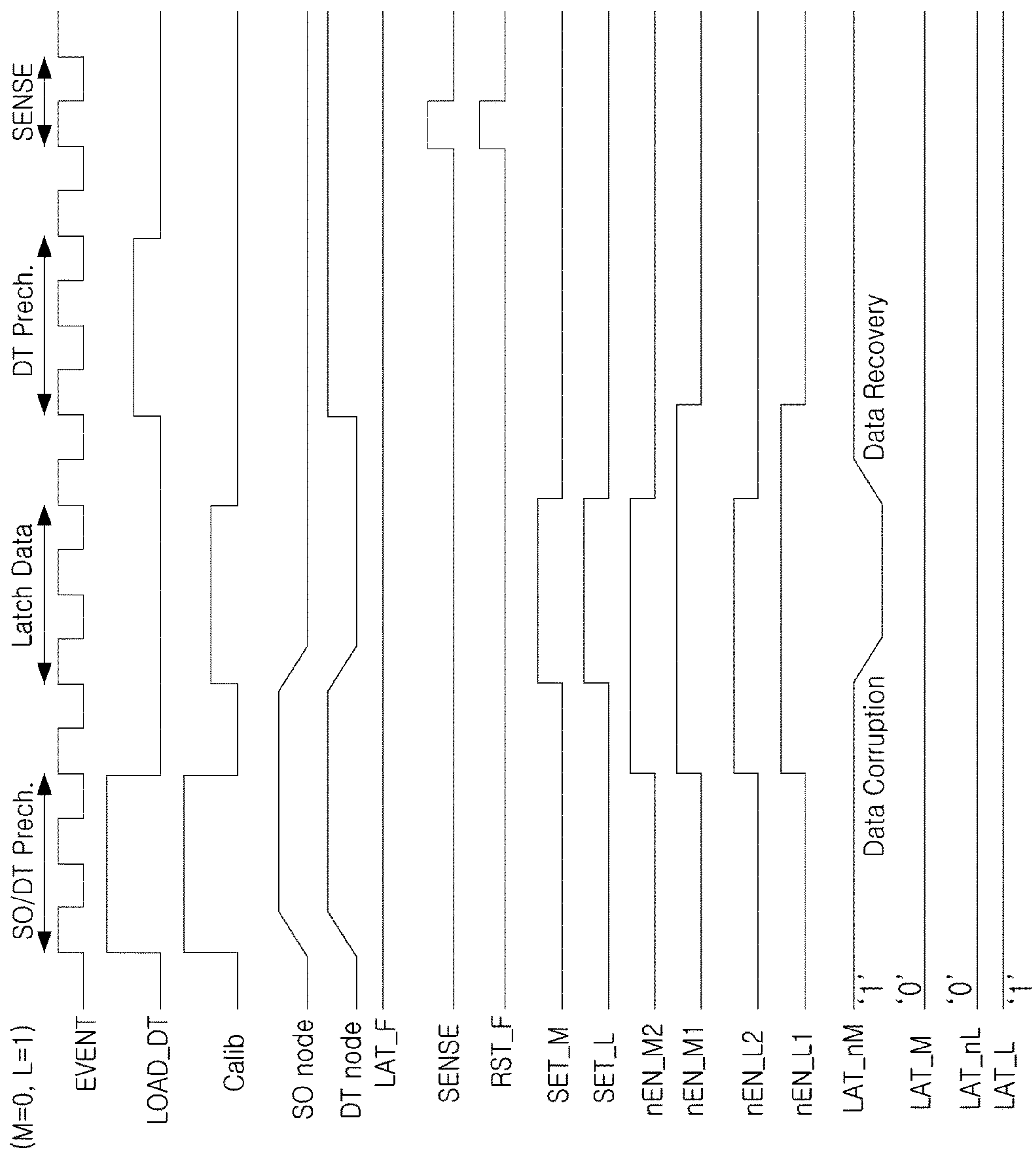
FIGS. 9A, 9B, 9C, and 9D are timing diagrams illustrating a dump sequence operation of the nonvolatile memory device according to an example embodiment of the present disclosure.

FIGS. 9A, 9B, 9C, and 9D are timing diagrams illustrating a dump sequence operation of the nonvolatile memory device 100 according to an example embodiment. The timing illustrated in FIG. 9A illustrates an example in which the values of M latch ML and L latch LL are reflected in a sensing node SO (~M & to L→~F). Referring to FIG. 9A, a dump sequence operation of the memory device 100 in response to a nonvolatile event clock EVENT may be as below. Here, data "0" may be stored in M latch ML and data "1" may be stored in L latch LL, and the value stored in M latch ML and the value stored in L latch LL may be reflected in sensing node SO. Accordingly, the reset node LAT_L of L latch LL may be a high-level state corresponding to data "1," and the set node LAT_nL of L latch LL may be a low-level state corresponding to data "0." The reset node LAT_M of M latch ML may be a low-level state corresponding to data "0," and the set node LAT_nM of M latch ML may be a high-level state corresponding to data "1."

In the SO/DT precharge period, the transfer node DT and the sensing node SO may be precharged while the load signal LOAD_DT and the calibration signal Calib become high-level states. In an example embodiment, the high-level in the SO/DT precharge period may be an analog level and may be higher than the power voltage VDD (e.g., a value higher than VDD+Vth). Depending on the characteristics of the transistor in which the threshold voltage Vth is transferred from the source to the drain at the gate level, the sensing node SO and the transfer node DT may be precharged with a higher voltage VDD+Vth rather than the power voltage VDD at the gate level.

Accordingly, the transfer node DT and the sensing node SO may have a high-level for a predetermined period of time (precharge time). After a predetermined period of time, by configuring both the first inverter activation signal NNE_L1 and the second inverter activation signal NNE_L2 of L latch LL and the first inverter activation signal NNE_M1 of M latch ML into a high-level state, the M latch ML and the L latch LL may be inactivated.

Thereafter, during the latch data reflection period (i.e., the discharge period of the sensing node SO), as the set switch signal SET_M of the M latch ML and the set switch signal SET_L of the L latch LL may become high-level states, and the calibration signal Calib signal becomes a high-level state for a predetermined period of time, the data of the M latch ML and the L latch LL may be reflected in the sensing node SO. In an example embodiment, the high-level state of the calibration signal Calib signal in the latch data reflection period may be applied as much as the power voltage VDD as a logic level. When reflecting the latch data, the level of the sensing node SO may be discharged to the ground terminal of the latch, or the latch value may be "1" (high-level) and discharging to the latch ground terminal may be performed, and accordingly, there may be no need to precharge the power voltage VDD. That is, in FIG. 9A, the voltage level state of the load signal LOAD_DT and the calibration signal Calib may be lower than the voltage level (equal to or higher than VDD+Vth) of the latch data period and the transfer node DT precharge period in the SO/DT precharge period. Here, the set switch signal SET_M of M latch ML and the set switch signal SET_L of L latch LL may be simultaneously opened using a tri-state latch.

Thereafter, after configuring the calibration signal Calib signal into a low-level state, a dump operation may be performed for a predetermined period of time. In this case, the first inverter activation signal NEN_L1 of the L latch LL may maintain a high-level for a predetermined period of time and the second inverter activation signal NEN_L2 may have a low-level. Also, the first inverter activation signal NEN_M1 of the M latch ML may maintain a high-level state, and the second inverter activation signal NEM_M2 may have a low-level state. In this case, even when the inversion data (data "1"; LAT_nM) of the M latch ML is damaged, data recovery may be performed using the data (data "0"; LAT_M) of the M latch ML according to the operation of the tri-state inverter. That is, by opening the tri-state inverter in sequence, discharged latch data may be restored using the original latch data on the opposite side. That is, even when the latch data is damaged, the data may be restored by operating the tri-state inverter. Thus, advantageously, the latch data may be protected by a tri-state latch operation.

Thereafter, as the load signal LOAD_DT becomes a high-level state in the transfer node precharge period, the transfer node DT may be precharged for a predetermined period of time. Accordingly, the transfer node DT has a high-level. Here, the high-level state of the load signal LOAD_DT may be discharged or not, and thus, precharging may need to be performed up to the power voltage VDD. Thereafter, the load signal LOAD_DT may have a low-level state. Thereafter, a dump operation may be performed for a predetermined period of time.

During the sensing period, as the sense signal SENSE becomes the high-level state for a predetermined period of time (for example, event clock cycle), and the reset switch signal RST_F of the F latch FL becomes the high-level state, F latch FL may determine whether the original data is maintained or discharged according to the value of sensing node SO. Next, the sense signal SENSE may become a low-level state and a dump operation may be performed.

When the nonvolatile memory device 100 according to an example embodiment precharges the entirety of the sensing node SOs during a program operation, a verification dump verify dump operation of updating subsequent state data to S latch SL (sense latch), or updating (~M &~L→~F, M=1, L=0) subsequent state data to F latch FL when precharging selected sensing node SO may be performed.

Figure 9B:
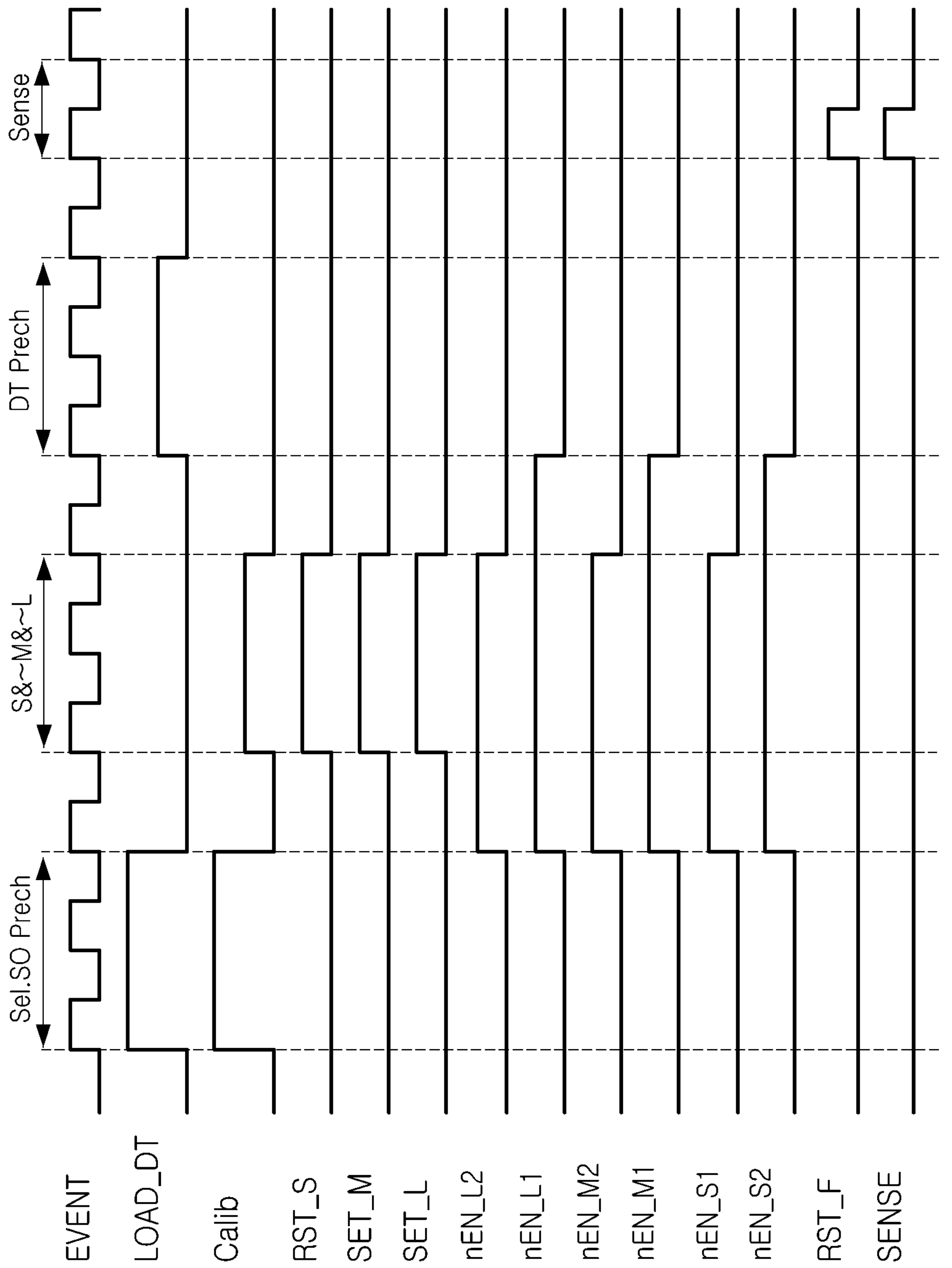

The timing illustrated in FIG. 9B is a diagram illustrating an example (S &~M &~L→~F) in which the S latch SL, the M latch ML, and the L latch LL may be reflected to the sensing node SO at once. By turning on the load transistor LDT and the calibration transistor CLT by the high-level load signal LOAT_DT and the high-level calibration signal Calib, the sensing node SO and the transfer node DT may be precharged.

Thereafter, values of the S latch SL, the M latch ML, and the L latch LL may be reflected in the sensing node SO. That is, in this process, the latch data of S the latch SL, the M latch ML, and the L latch LL may be transferred to the sensing node SO. To electrically connect the latches SL, ML, LL, the transfer node DT, and the sensing node SO at once, switches (for example, SWT1 and SWT2 in FIG. 5) connecting the latches SL, ML, LL and the transfer node DT may be turned on, and the calibration transistor Calib connecting transfer node DT and sensing node SO may be turned on. There may be two switches SWT1 and SWT2 connecting each of the latches SL, ML, and LL to the transfer node DT. In this case, the corresponding switch may need to be opened depending on which dump is performed.

The dump operation to be performed in FIG. 9B may be S&~M &~L→~F. When LAT_S=1 (high-level as VDD), LAT_M=0, LAT_L=0, sensing node SO may become a high-level. Accordingly, corresponding switches may be opened by the S latch reset signal RST_S, the M latch set signal SET_M, and the L latch set signal SET_L having high-levels. By the S latch reset signal RST_S, the transfer node DT may be connected to the node LAT_S, and by M latch set signal SET_M and L latch set signal SET_L, the transfer node DT may be connected to the node LAT_nM and the node LAT_nL, respectively. Accordingly, when LAT_S=1, LAT_nM=1 (LAT_M=0), and LAT_nL=1 (LAT_nL=0), the sensing node SO may be maintained on a high-level.

Before turning on switches SWT1 and SWT2 connecting the latches SL, ML, LL to the transfer node DT, each of the first and second inverter of latches SL, ML, LL may be inactivated by inverter activation signals NEN_S1, nEN_S2, nEN_M1, nEN_M2, nEN_L1, and nEN_L2 having a high-level. Through the discharge phase, the latch data may be reflected on the sensing node SO, thereafter, the switch connecting the transfer node DT of latches SL, ML, LL may be turned off, and thereafter, by turning on the corresponding inverter activation signals NEN_S1, nEN_M2, and nEN_L2 in sequence in the latches SL, ML, and LL, a data restoring operation may be performed.

In this case, since the latch nodes LAT_S, LAT_nM, and LAT_nL are electrically connected to the transfer node DT in the discharge phase, the data of the corresponding node may be damaged. Accordingly, a non-damaged side of tri-state latch, that is, side not connected to transfer node DT, the damaged latch node may be restored by activating the tri-state inverter in which the latch value of nodes LAT_nS, LAT_M, and LAT_L may be input. Following this, the other tri-state inverters of each of the latches SL, ML and LL may also be activated. In FIG. 9B, the inverter activation signals NEN_L2, nEN_M2, and nEN_S1 may decrease to low-level such that the second inverter of L latch LL, the second inverter of M latch ML, and the first inverter of S latch SL may be turned on first. And, then, the transfer node DT may be precharged by turning on the load transistor LDT by the high-level load signal LOAT_DT.

Thereafter, a sense operation may be performed. A discharge pass discharging to the ground terminal GND through the node LAT_F, the transfer node DT, and the sense transistor SNT may be connected to each other by a high-level F latch reset signal RST_F and the sense signal SENSE. In this case, the value of the F latch FL may be determined according to whether the value of the sensing node SO connected to the gate of the sensing node transistor SOT is high/low-level. For example, when the sensing node SO is on a high-level, the value of F latch FL may be discharged to the ground terminal GND through a discharge pass. When the sensing node SO is at a low-level, since the sensing node transistor SOT is in a turned-off state, no operation may be performed.

Figure 9C:
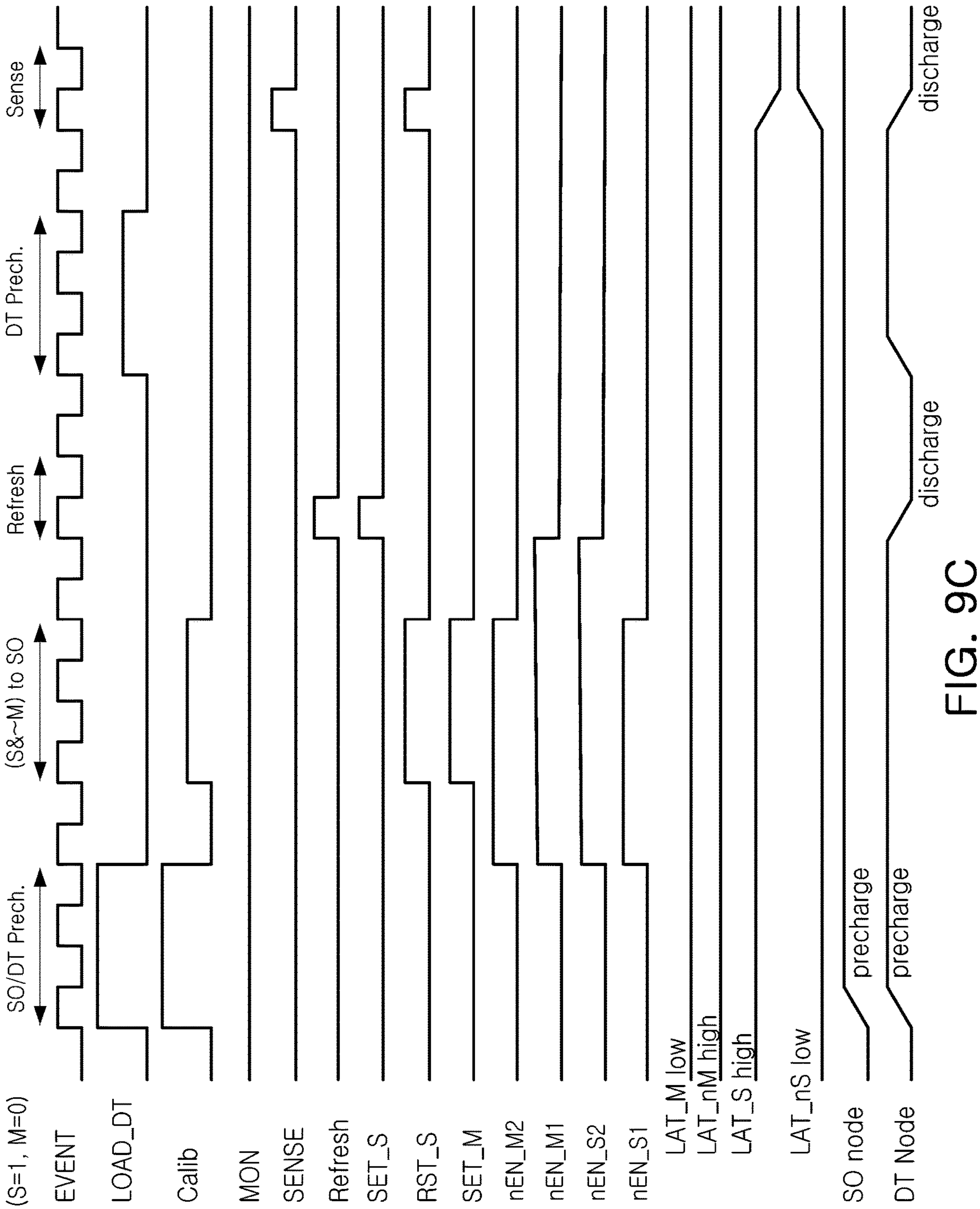

The timing illustrated in FIG. 9C may relate to the dump PDRS operation (S &~M=~S), when S=1 and M=0. The transfer node DT and the sensing node SO may be precharged by a high-level load signal LOAD_DT and a high-level calibration signal Calib. The latch data of the S latch SL and the M latch ML may be reflected in the sensing node SO. After inactivating each of the tri-state inverters of the S latch SL and the M latch ML, the corresponding latch nodes may be connected to the transfer node DT according to the high-level of .S latch reset signal RST_S and the high-level of M latch set signal SET_M. Also, the transfer node DT may be connected to the sensing node SO by turning on the calibration transistor CLT by the high-level calibration signal Calib. When LAT_S=1 and LAT_M=0, since the sensing node SO may need to be maintained on a high-level, the switch signals RST_S and SET_M controlling switches connected to the node LAT_S and the node LAT_nM may have a high-level.

When LAT_M=0 and LAT_S=1, the entirety of electrically connected latch values may have a high-level. That is, LAT_S=high and LAT_nM=high. In this case, inverter activation signals NEN_S1, nEN_S2, nEN_M1, and nEN_M2 may be the entirety of high-level, and the corresponding tri-state inverters may be in the inactivation state. Thereafter, an operation of reflecting the latch value to the sensing node SO may be performed. In this case, since node LAT_S, node LAT_nM, sensing node SO, and transfer node DT may be a state precharged with a power voltage VDD (that is, high-level state="1"), such that the sensing node SO may not be discharged. That is, the sensing node SO may maintain a high-level.

After the above-described latch data reflection operation is completed, switches (see FIG. 5, SWT1 and SWT2) connecting the latch and the transfer node DT may be turned off. Thereafter, the corresponding tri-state inverter may be activated as the inverter activation signals NEN_M2 and nEN_S1 may have a low-level in sequence. Accordingly, damaged latch data may be recovered. By connecting the nodes LAT_S and LAT_nM to the transfer node DT and the sensing node SO, the latch data may be damaged. Accordingly, there may be nodes LAT_nS and LAT_M for storing latch values not damaged according to the inactivation of the tri-state inverter. Accordingly, by first activating tri-state inverters receiving the nodes LAT_nS and LAT_M as gate inputs for storing undamaged latch values, the nodes LAT_S and LAT_nM may be restored, and then the other tri-state inverters may be activated as well.

Next, the node LAT_nS may be discharged to "0" by configuring the S latch set signal SET_S and the refresh signal Refresh to a high-level state for a predetermined period of time (e.g., 80 ns). Accordingly, the node LAT_S may be refreshed to "1." Thereafter, the transfer node DT may be precharged to the power voltage VDD before the sense operation by the high-level load signal LOAD_DT.

Following this, a sense operation may be performed. When sensing node SO is high-level (when S=1, M=0, that is, when S &~M is true), node LAT_S may need to be discharged (~S). Accordingly, when sensing node SO is on a high-level, node LAT_S may be discharged. That is, the switch connected to node LAT_S may be turned on by the high-level reset signal RST_S, and the sense transistor SNT may be turned on by the high-level sense signal SENSE. In this case, since the sensing node SO is in a precharge state, the sensing node transistor SOT receiving the sensing node SO as a gate input may be in a turn-on state. Accordingly, the node LAT_S may be discharged to the ground terminal of the sensing node transistor SOT. That is, when S=1 and M=0, ~S=0 may be executed.

Figure 9D:
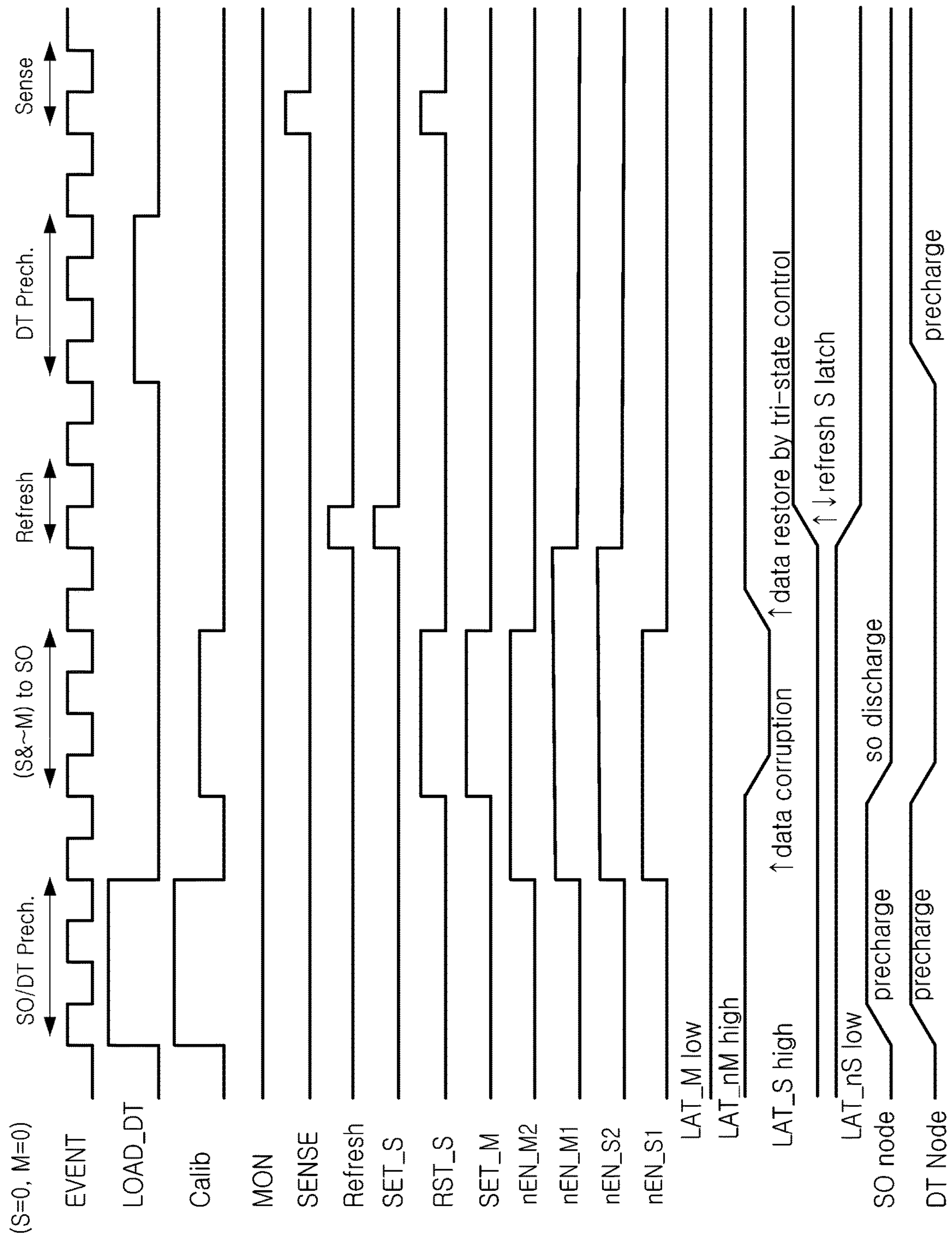

The timing illustrated in FIG. 9D may relate to a dump PDRS operation (S &~M= to S). In this case, S=0 and M=0. The timing in FIG. 9D may be the same dump as in FIG. 9*c*, and may be an example embodiment in which the data of S latch SL is different. When S=0 and M=0, the S &~M condition may not be met. Accordingly, the ~S operation may not be performed. That is, S may have a high-level as a final state thereof. The sensing node SO and the transfer node DT may be precharged by a high-level load signal LOAD_DT and a high-level calibration signal Calib. Thereafter, the latch data may be reflected in the sensing node SO. That is, by inactivating the entirety of tri-state inverters, connecting corresponding latch nodes to the transfer node DT by the high-level S latch reset signal RST_S and the M latch set signal SET_M, and turning on the calibration transistor CLT, the transfer node DT and the sensing node SO may be connected to each other.

When LAT_S=1 and LAT_M=0, since the sensing node SO is maintained on a high-level, by turning on the switch transistor connected to the node LAT_S and the node LAT_nM, the transfer node DT and the sensing node SO may be electrically connected to each other. When LAT_M=0 and LAT_S=0, electrically connected latch values may be LAT_S=low and LAT_nM=high. In this case, the entirety of the tri-state inverters may be inactivated, and an operation to reflect the latch value to the sensing node SO may be performed. Since the node LAT_S has a low-level, the high-level of node LAT_nM and the high-level of sensing node SO may be discharged to the ground terminal GND of the node LAT_S.

After the latch data reflection operation, switch transistors connecting the latch to the transfer node DT may be turned off. Thereafter, corresponding tri-state inverters may be sequentially activated to restore damaged latch data. For example, since the nodes LAT_S and LAT_nM are connected to transfer node DT and sensing node SO, the nodes LAT_S and LAT_nM may have a possibility of data damage. Accordingly, by preferentially activating the tri-state inverters to which the corresponding inversion nodes LAT_nS and LAT_M are received as gate inputs (e.g., nEN_M2 and nEN_S1 with low-levels), the levels of nodes LAT_S and LAT_nM may be restored. Thereafter, the other tri-state inverters may also be activated in sequence. Next, by turning on the switch transistor according to the high-level set signal SET_S and turning on the refresh transistor according to the high-level refresh signal Refresh and discharging node LAT_nS to "0," the node LAT_S may be refreshed to "1."

Thereafter, the transfer node DT may be precharged, and a sense operation may be performed. When the sensing node SO is on a high-level, (when S=1, M=0, that is, when S &~M are true), the node LAT_S may be discharged (~S). Accordingly, when sensing node SO is on a high-level, the node LAT_S may be discharged. In this case, since the sensing node SO is in a discharged state, the sensing node transistor SOT receiving the sensing node SO as a gate input may be in a turned-off state. Accordingly, the node LAT_S may not be discharged and may maintain the high-level as is in the refreshed state. That is, when S=0 and M=0, ~S may not be executed (S=0 does not occur).

Figure 10:
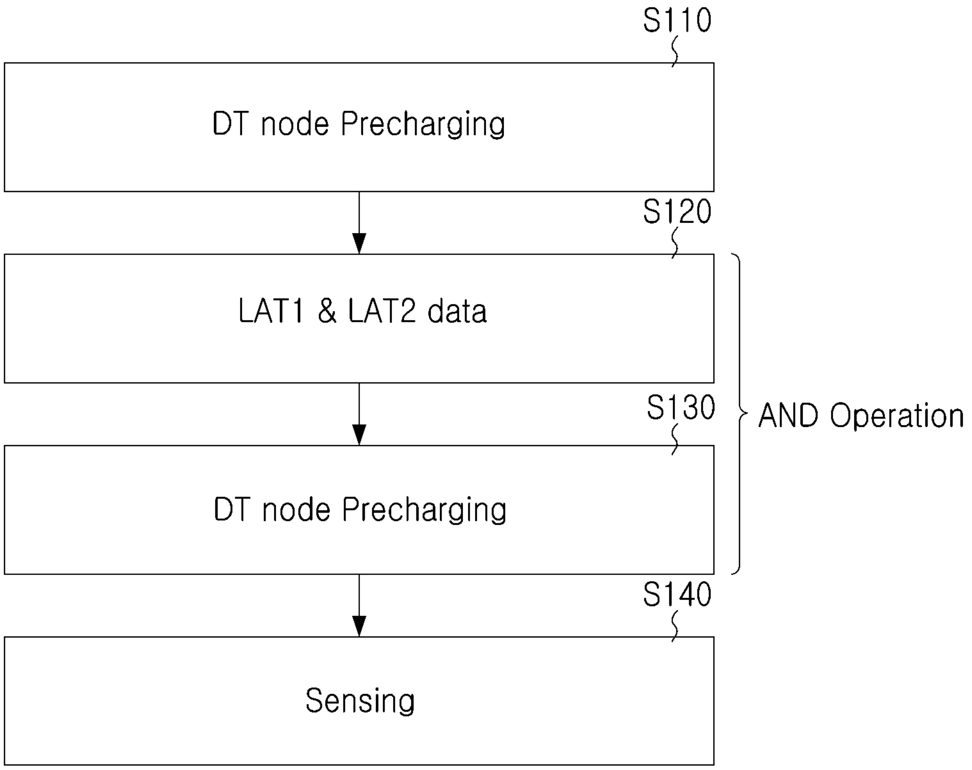
FIG. 10 is a flowchart illustrating a method of operating a nonvolatile memory device 100 according to an example embodiment of the present disclosure.

FIG. 10 is a flowchart illustrating a method of operating a nonvolatile memory device 100 according to an example embodiment. Referring to FIGS. 1 to 10, the nonvolatile memory device 100 may operate as below. The transfer node DT of the page buffer PB may be precharged (S110). Thereafter, the data of first latch LAT1 and second latch LAT2 in the page buffer PB may be reflected in sensing node SO (S120). Thereafter, the transfer node DT may be precharged (S130). Thereafter, the data of the sensing node SO may be sensed and stored in the latch (S140). In an example embodiment, when data of one of the first latch LAT1 and the second latch LAT2 is damaged, data may be restored using a tri-state latch operation (inversion data of undamaged latch).

In an example embodiment, the sensing node SO may be precharged by connecting the transfer node DT to the sensing node SO after precharging the transfer node DT. In an example embodiment, during a program operation, data stored in first latch LAT1 may be "1" and data stored in second latch LAT2 may be "0." In an example embodiment, the tri-state latch may include a first inverter INV1 and a second inverter INV2 having tri-state transistors, and by turning on the tri-state transistors of the first inverter INV1 and the second inverter INV2 in sequence, data may be restored. In an example embodiment, data may be restored in unit time.

Figure 11:
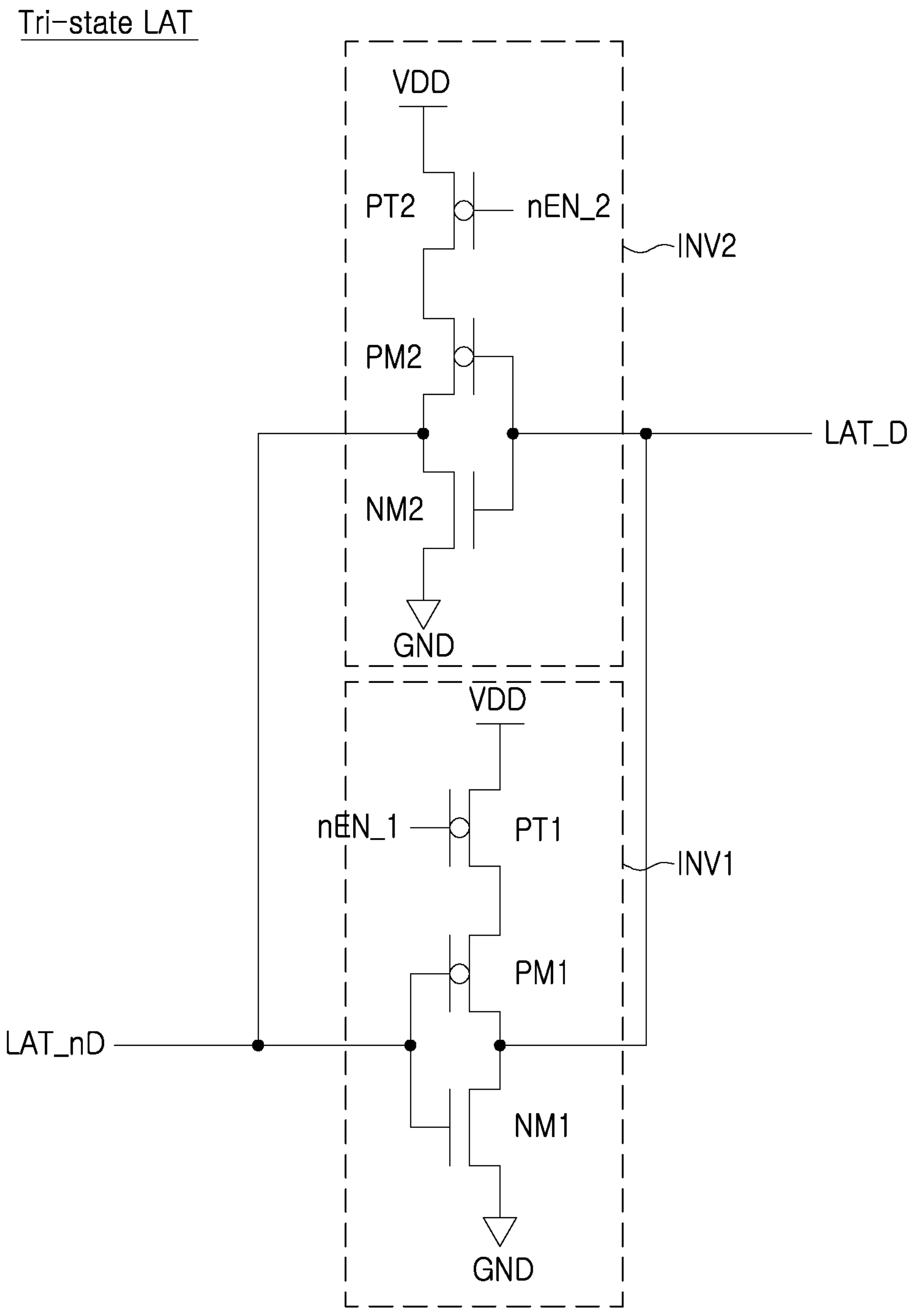
FIG. 11 is a diagram illustrating a 3-state latch according to an example embodiment of the present disclosure.

FIG. 11 is a diagram illustrating a 3-state latch according to an example embodiment. Referring to FIG. 11, the tri-state latch may consist of first and second inverters. Here, each of the first and second inverters INV1 and INV2 may be a tri-state inverter. The first inverter INV1 may include transistors PT1, PM1, and NM1. Transistor PT1 may be connected to a power terminal VDD in response to a first inverter activation signal NEN_1. The transistor PT1 may be a PMOS transistor. The transistor PM1 may be connected between the transistor PT1 and a node LAT_D. The transistor PM1 may be a PMOS transistor. The transistor NM1 may be connected between the node LAT_D and a ground terminal GND. The transistor NM1 may be an NMOS transistor. The transistor PM1 and the transistor NM1 may have a common gate connected to the node LAT_nD.

The second inverter INV2 may include transistors PT2, PM2, and NM2. The transistor PT2 may be connected to the power terminal VDD in response to the second inverter activation signal NEN_2. The transistor PT2 may be a PMOS transistor. The transistor PM2 may be connected between the transistor PT2 and the node LAT_nD. The transistor PM2 may be a PMOS transistor. The transistor NM2 may be connected between the node LAT_nD and the ground terminal GND. The transistor NM2 may be an NMOS transistor. The transistor PM2 and the transistor NM2 may have a common gate connected to the node LAT_D.

FIGS. 12A, 12B, 12C, and 12D are diagrams illustrating a process of restoring data through a 3-state latch operation of a page buffer according to an example embodiment. Here, the tri-state latch may be implemented as a PMOS tri-state latch and an NMOS tri-state latch. For PMOS tri-state latch, On=Low(0) and Off=High(1). NMOS tri-state latch, On=High(1) Off=Low(0).

Figure 12A:
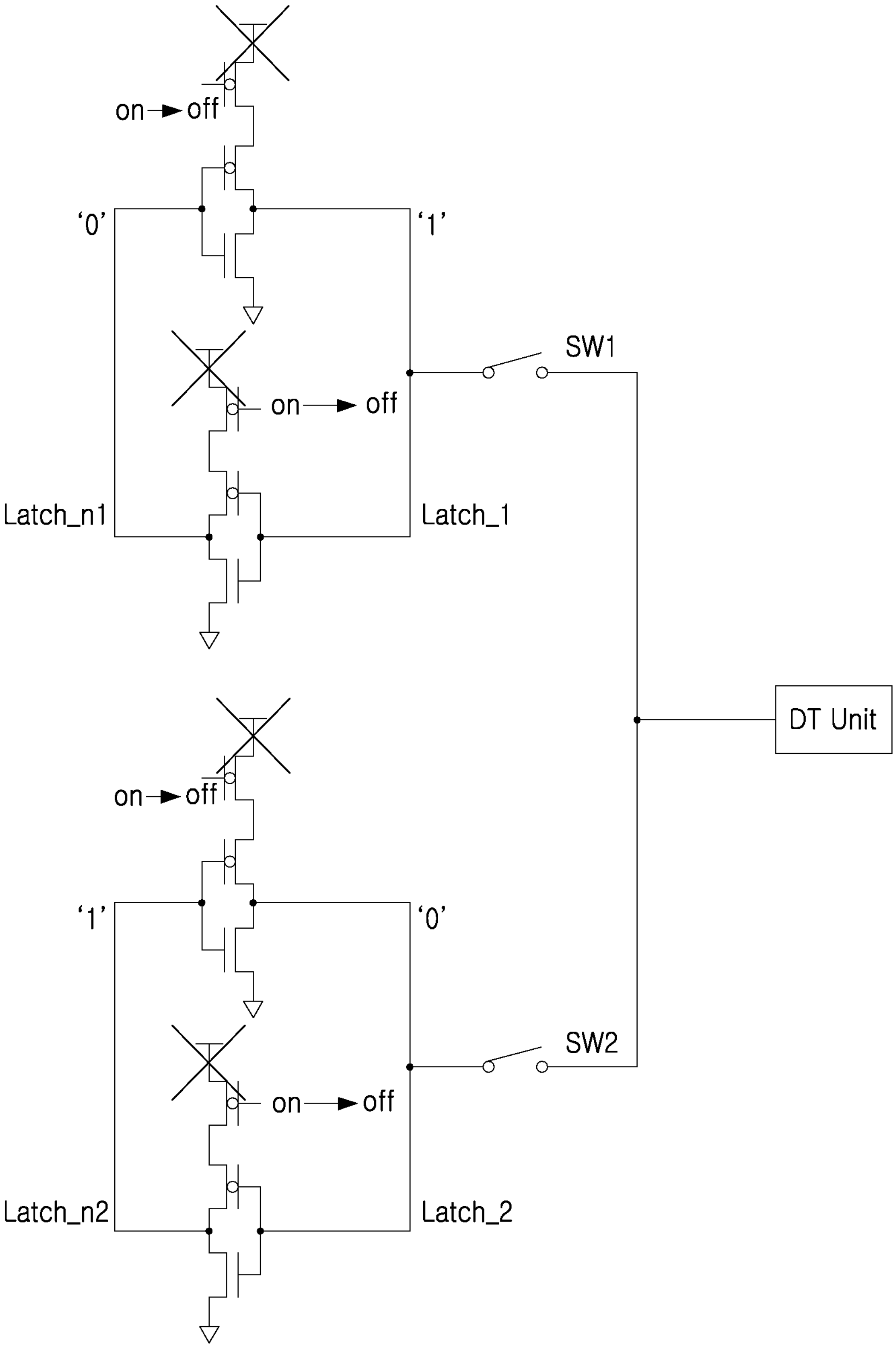
FIGS. 12A, 12B, 12C, and 12D are diagrams illustrating a process of restoring data through a 3-state latch operation of a page buffer according to an example embodiment of the present disclosure.

Referring to FIG. 12A, a process of simultaneously operating in latches LAT1 and LAT2 in the precharge period of the DT portion is illustrated. Data node Latch_1 of first latch LAT1 may store data "1," and inversion data node Latch_n1 may store data "0." Data node Latch_2 of second latch LAT2 may store data "0," and inversion data node Latch_n2 may store data "1." The on-state of the tri-state PMOS transistors of the first latch LAT1 and the second latch LAT2 may be turned off. As the switches SW1 and SW2 are turned off, the latches LAT1 and LAT2 are not connected to the DT portion.

Figure 12B:
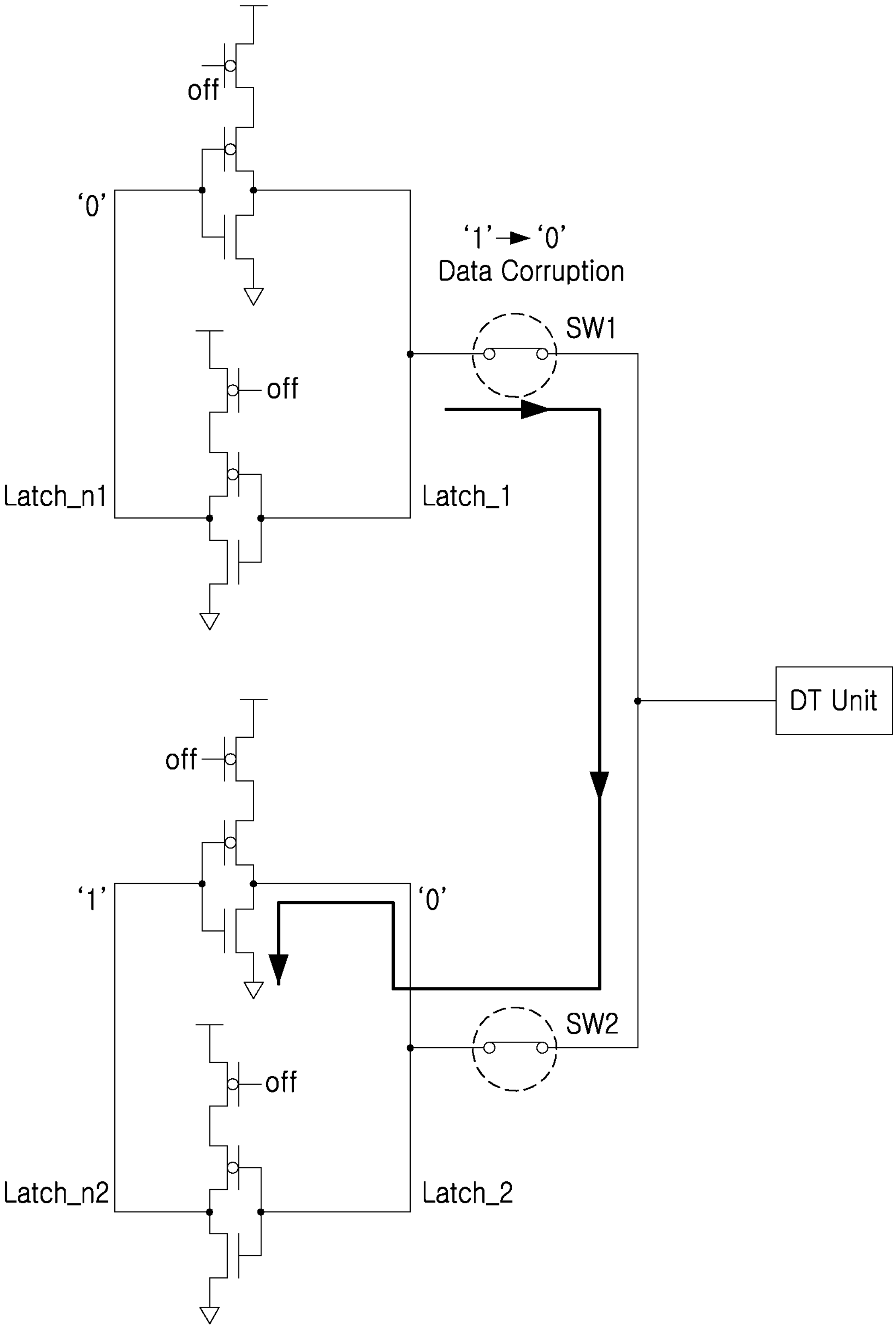

Referring to FIG. 12B, the data reflection process of the first latch and the second latch is illustrated. As the switches SW1 and SW2 are turned on, the latches LAT1 and LAT2 may be connected to the DT portion. Accordingly, the DT portion may be discharged through the discharge pass of the second latch LAT2. In this case, the voltage of first latch LAT1 may also be discharged through this discharge pass, such that the data of data node Latch_1 of first latch LAT1 may be damaged from "1" to "0."

Figure 12C:
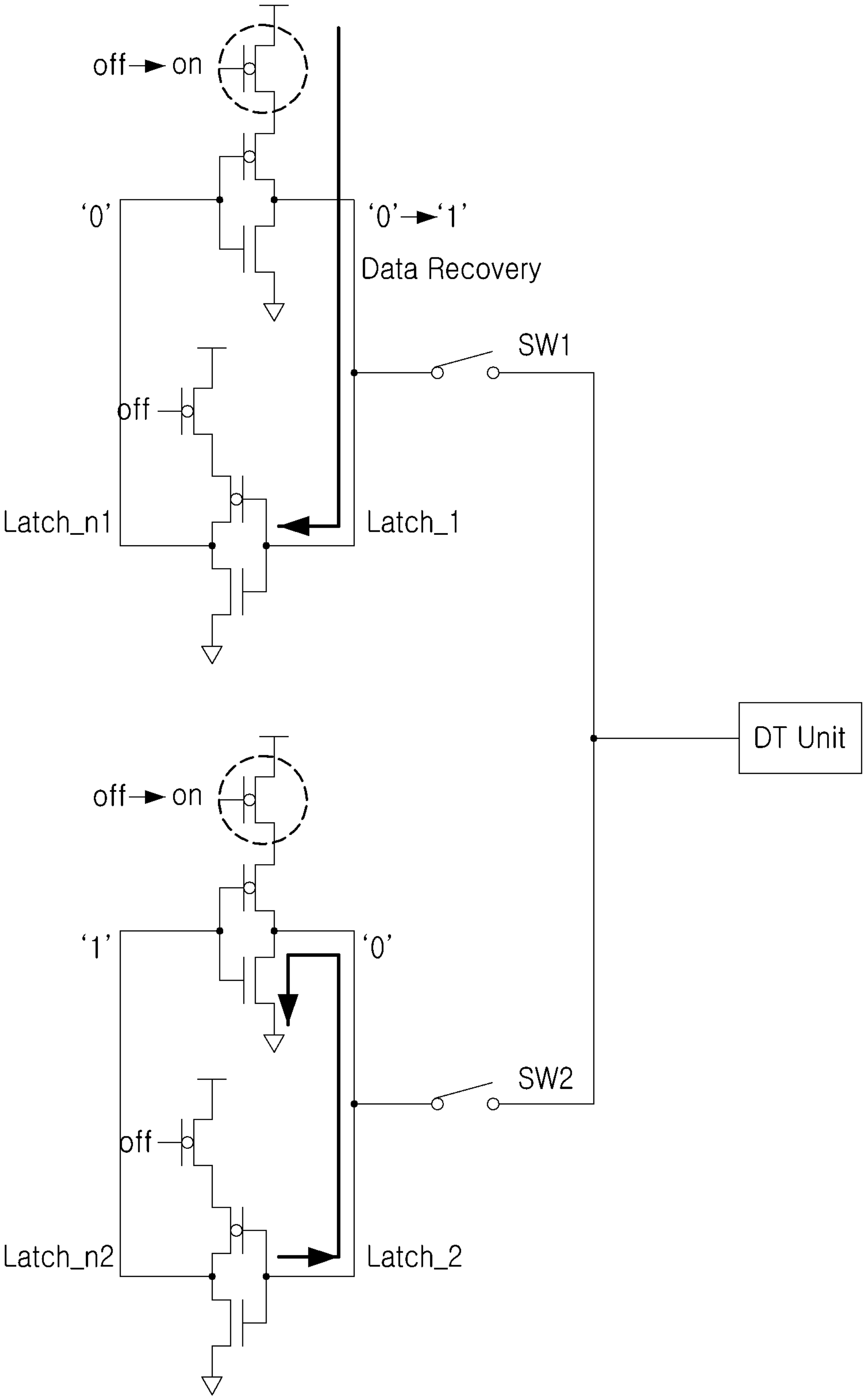

Referring to FIG. 12C, a process of restoring latch data through a tri-state latch operation is illustrated. In this case, the switches SW1 and SW2 may be turned off, such that the latches LAT1 and LAT2 may not be connected to the DT portion. Even when the data of the data node Latch_1 of the first latch LAT1 is damaged, the data of the inversion data node Latch_n1 of the first latch LAT1 may not be damaged. Accordingly, by changing the tri-state PMOS transistor of first latch LAT1 and the second latch LAT1 from a turned off-state to a turned on-state (that is, by turning on the tri-state transistors in sequence), data of the data node Latch_1 of the first latch LAT1 may be recovered using data of inversion data node Latch_n1 of the first latch LAT1 which is not damaged.

Figure 12D:
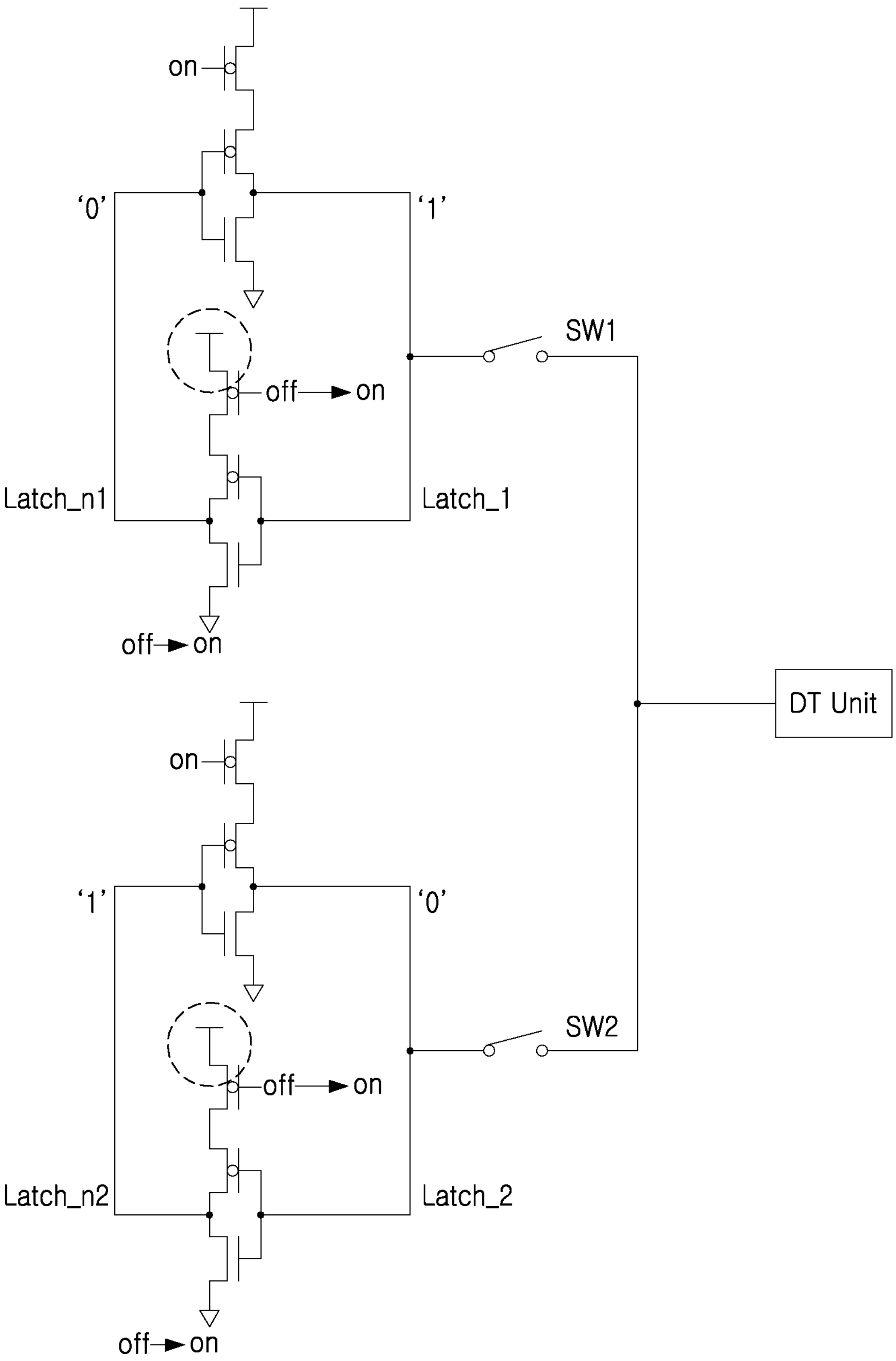

In FIG. 12D, the example in which the state may be return to an initial state by configuring the PMOS transistors of the tri-state latch to be in a turned on-state.

The nonvolatile memory device 100 according to an example embodiment may enable data restoration through a tri-state latch operation.

Figure 13A:
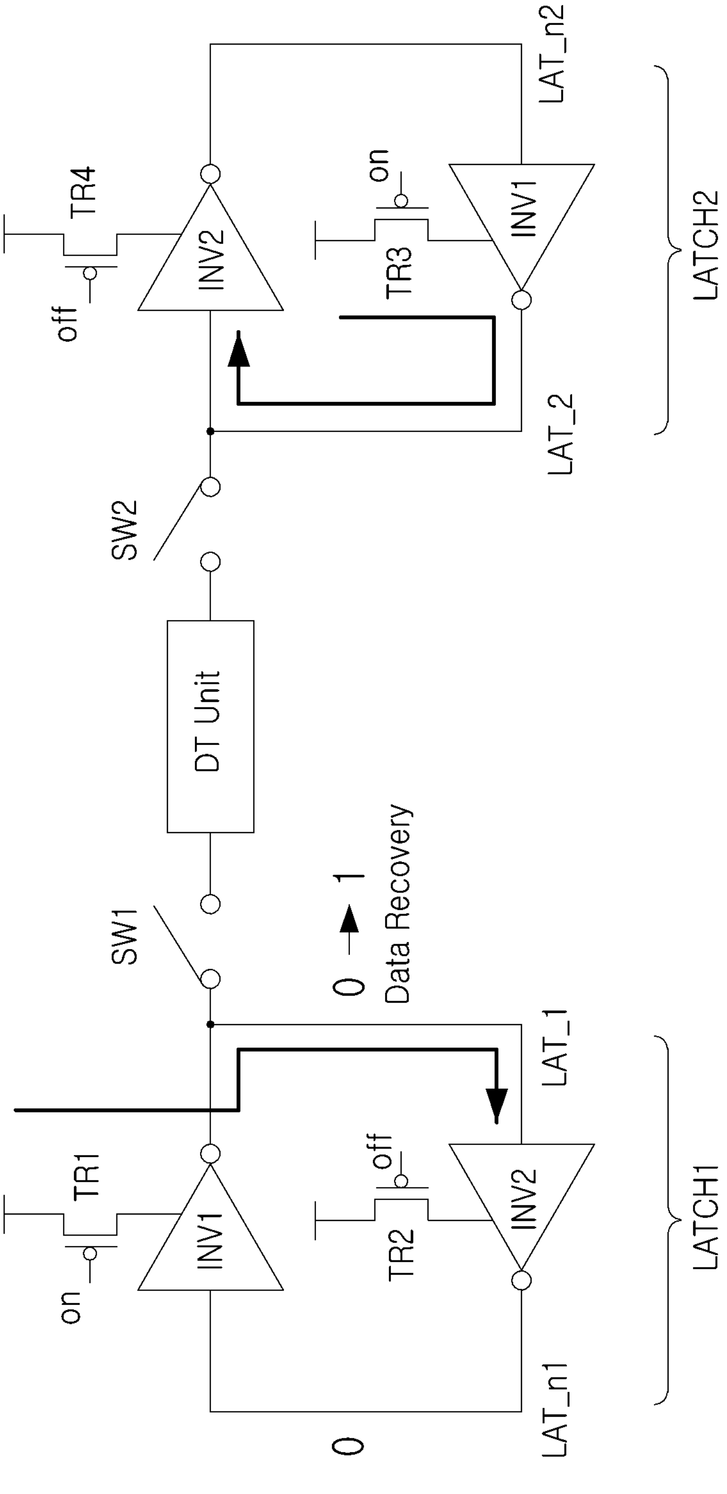
FIGS. 13A and 13B are diagrams illustrating a process of restoring latch data in a nonvolatile memory device according to an example embodiment of the present disclosure.
Figure 13B:
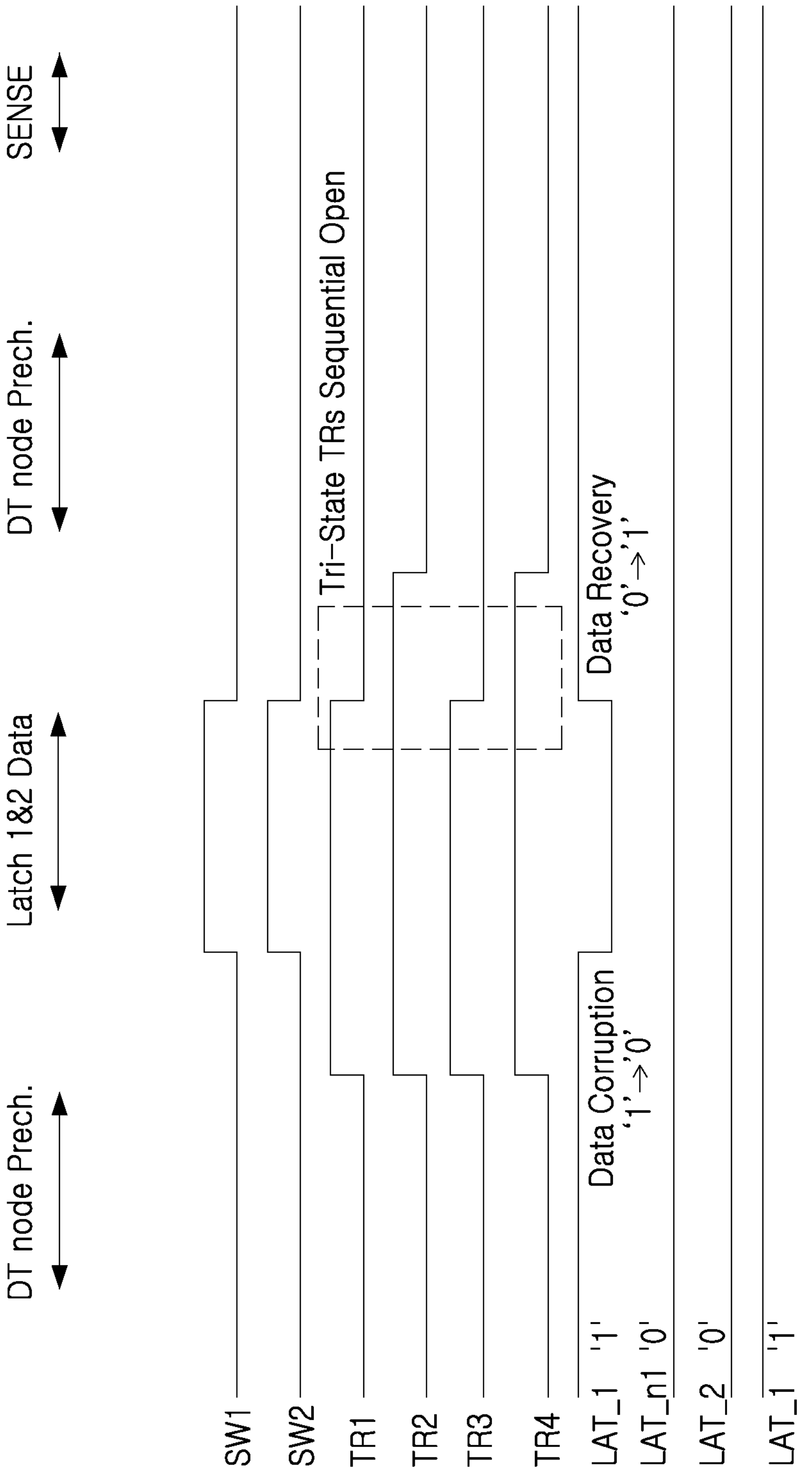

FIGS. 13A and 13B are diagrams illustrating a process of restoring latch data in a nonvolatile memory device according to an example embodiment. Referring to FIGS. 13A to 13B, when data of first latch LATCH1 and data of second latch LATCH2 are reflected, data of one of latches may be damaged. When the latch data is reflected here, the tri-state transistors TR1 to TR4 may be turned off. For example, reset data LAT_1 of first latch LATCH1 may be damaged in data reflection operation. In this case, the tri-state transistors TR1 to TR4 may be turned on in sequence for data recovery. Accordingly, reset data LAT_1 of first latch LATCH1 may be restored according to set data LAT_n1 of first latch LATCH1 which is not damaged.

It may be necessary to define a layout pattern such that a node not monitored may not experience coupling by the sensing node SO.

Figure 14A:
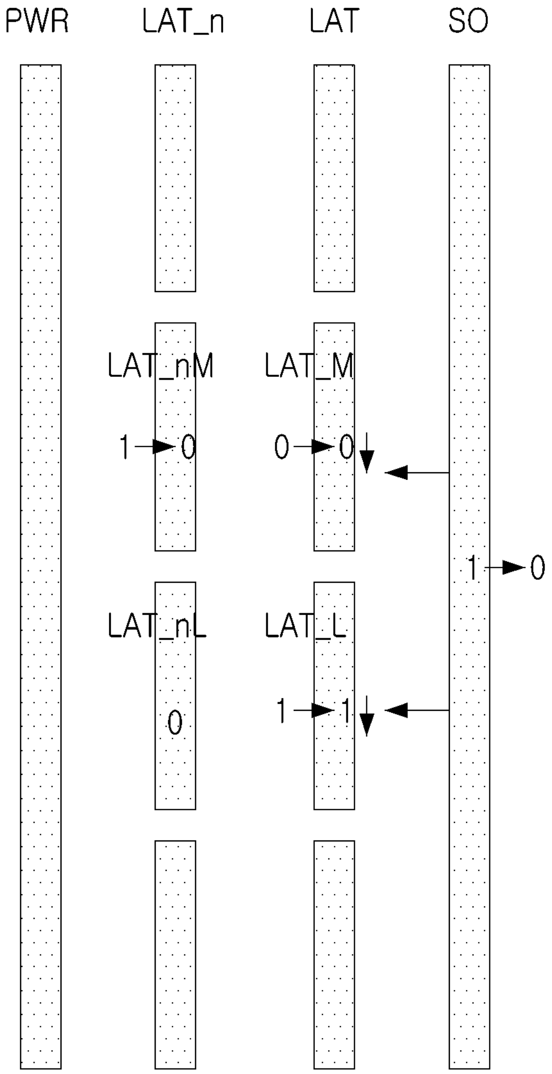
FIGS. 14A and 14B are diagrams illustrating a layout of a page buffer according to an example embodiment of the present disclosure.
Figure 14B:
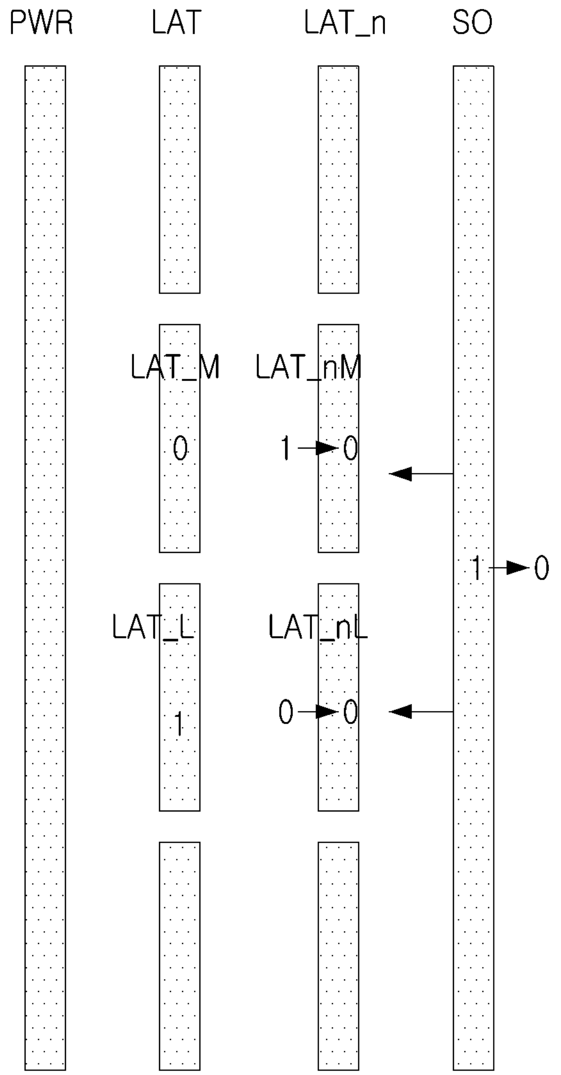

FIGS. 14A and 14B are diagrams illustrating a layout of a page buffer according to an example embodiment. Referring to FIG. 14A, a reset data node LAT, a set data node LATn, and a power node PWR may be disposed in sequence adjacent to the sensing node SO. In this case, as valid node coupling occurs, the state may be changed by the coupling of the sensing node SO of the data node of the latch. Referring to FIG. 14B, a set data node LATn, a reset data node LAT, and a power node PWR may be disposed in sequence adjacent to the sensing node SO. In this case, even when data is damaged during the process of coupling and dumping the sensing node SO, the damaged node may be restored by the non-damaged node.

Figure 15:
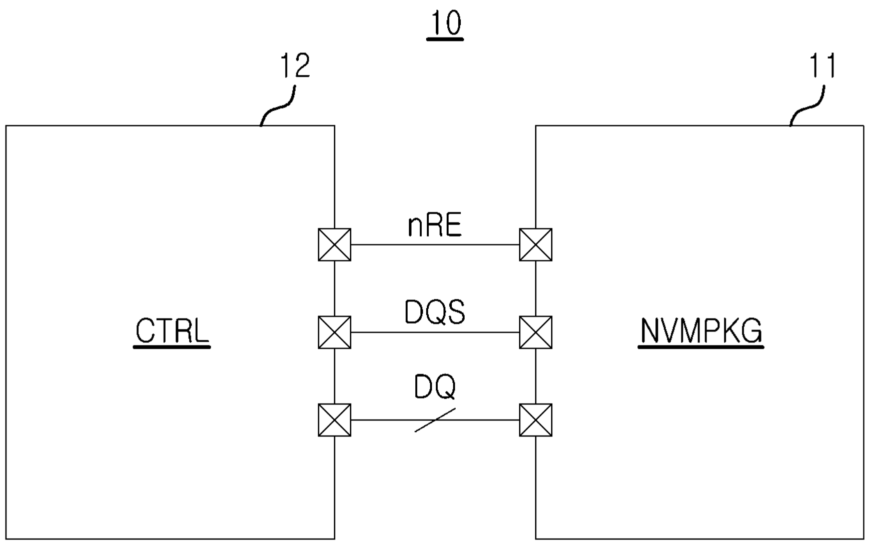
FIG. 15 is a diagram illustrating a storage device according to an example embodiment of the present disclosure.

FIG. 15 is a diagram illustrating a storage device 10 according to an example embodiment. Referring to FIG. 15, the storage device 10 may include a nonvolatile memory package 11 (NVM PKG) and a controller 12 (CTRL) controlling the nonvolatile memory package 11. The nonvolatile memory package 11 (NVM PKG) may include an interface chip (frequency boosting interface chip (FBI), or "buffer chip") and a plurality of nonvolatile memory devices connected to internal channels. The interface chip FBI may be connected to the controller 12 through a channel. Here, channel CH1 may be connected to a first internal channel or a second internal channel through an interface chip. The interface chip may include a retraining check circuit internally determining the need for retraining. In an example embodiment, the retraining check circuit may include a built-in self-test (BIST) circuit, an oscillator, or a delayed locked loop circuit (DLL). Also, the interface chip may compatibly implement an interface protocol communicating with the controller 12 and an interface protocol communicating with nonvolatile memory devices. Each of the nonvolatile memory devices may be implemented to store data. A plurality of nonvolatile memory devices may be connected to each of the internal channels. In an example embodiment, in the nonvolatile memory package 11, nonvolatile memory devices may be implemented in a stacked structure. Here, each of the plurality of nonvolatile memory devices may be implemented to perform a dump sequence operation as described in FIGS. 1 to 14.

The controller 120 (CTRL) may be implemented to control overall operations of the nonvolatile memory package 11. The controller 12 may perform functions necessary for data management of the nonvolatile memory package 11, such as address mapping, error correction, garbage collection, wear-leveling, bad block management, or data recovery. Here, these functions may be implemented in terms of hardware, software, or firmware.

Figure 16:
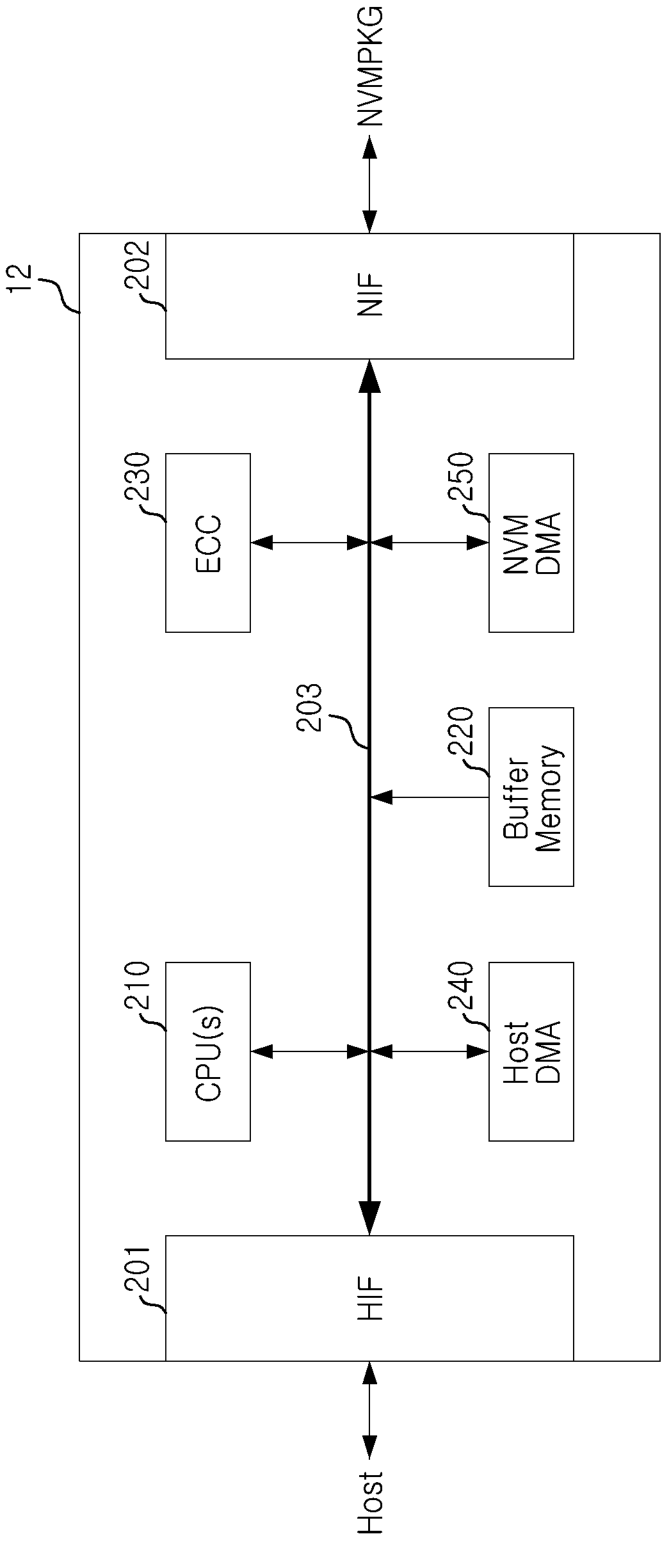
FIG. 16 is a diagram illustrating a controller according to an example embodiment of the present disclosure.

FIG. 16 is a diagram illustrating a controller 12 according to an example embodiment. Referring to FIG. 16, the controller 12 may include a host interface circuit 201, a volatile memory interface circuit 202, a bus 203, at least one processor 210 (CPCs), a buffer memory 220, an error correction circuit 230 (ECC), a host DMA circuit 240 and a nonvolatile memory DMA circuit 250. The host interface circuit 201 may be implemented to transmit/receive packets with a host. A packet transmitted from the host to the host interface circuit 201 may include a command or write data to a nonvolatile memory device. A packet transmitted from the host interface circuit 201 to the host may include a response to a command or read data from a nonvolatile memory device.

The memory interface circuit 202 may transmit write data to the nonvolatile memory 100 to the nonvolatile memory 100 or may receive read data from the nonvolatile memory 100. The memory interface circuit 202 may be implemented to comply with standard protocols such as JEDEC (Joint Electron Device Engineering Council) Toggle or ONFI (Open NAND Flash Memory Interface).

At least one processor 210 (CPUs) may be implemented to control overall operations of the storage device 12. The processor 210 may perform various management such as manages cache/buffer management, firmware management, garbage collection management, wear leveling management, data deduplication management, read refresh/reclaim management, bad block management, multi-stream management, mapping management between host data and nonvolatile memory, quality of service (QOS) management, system resource allocation management, nonvolatile memory queue management, read level management, erase/program management, hot/cold data management, power loss protection management, dynamic thermal management, initialization management, and redundant array of inexpensive disk (RAID). These management operations may be implemented in terms of hardware/firmware/software.

The buffer memory 220 may temporarily store data to be written to a nonvolatile memory device or read data from a nonvolatile memory device. In an example embodiment, the buffer memory 220 may be configured as a component included in the controller 12. In another example embodiment, the buffer memory 220 may be disposed externally of the controller 12. Also, the buffer memory 1220 may be implemented as a volatile memory, such as a static random access memory (SRAM), a dynamic RAM (DRAM), a synchronous RAM (SDRAM), etc., or a nonvolatile memory, such as a flash memory, a phase-change RAM (PRAM), a magneto-resistive RAM (MRAM), a resistive RAM (ReRAM), a ferroelectric RAM (FRAM), etc.

The error correction circuit 230 may generate an error correction code (ECC) during a program operation and may restore data using the error correction code during a read operation. That is, the error correction circuit 230 may generate an error correction code ECC for correcting a failure bit or an error bit of data received from a nonvolatile memory device. Also, the error correction circuit 230 may form data to which parity bits are added by performing error correction encoding on data provided to the nonvolatile memory device. Parity bits may be stored in the nonvolatile memory device 100.

Also, the error correction circuit 230 may perform error correction decoding on data output from a nonvolatile memory device. The error correction circuit 230 may correct errors using parity. The error correction circuit 1230 may correct an error using a low-density parity check (LDPC) code, BCH code, turbo code, Reed-Solomon code, convolution code, recursive systematic code (RSC), and coded modulation such as trellis-coded modulation (TCM), and block coded modulation (BCM). When error correction is impossible in the error correction circuit 1230, a read retry operation may be performed.

The packet manager may generate a packet according to protocol of an interface negotiated with the host or parse various data from a packet received from the host. The encryption device may perform at least one of an encryption operation and a decryption operation on data input to the controller 12 using a symmetric-key algorithm. The encryption device may perform encryption and decryption of data using the advanced encryption standard (AES) algorithm. An encryption device may include an encryption module and a decryption module. In an example embodiment, an encryption device may be implemented in terms of hardware/software/firmware. The encryption device may perform a self-encryption disk (SED) function or a trusted computing group (TCG) security function. The SED function may store encrypted data in a nonvolatile memory device using an encryption algorithm or decrypt encrypted data from a nonvolatile memory device. The encryption/decryption operation may be performed using an internally generated encryption key. The TCG security function may provide a mechanism enabling access control to user data of the storage device 10. For example, the TCG security function may perform an authentication procedure between an external device and the storage device 10. In an example embodiment, the SED function or TCG security function may be optionally selected.

The host DMA circuit 240 may be implemented to control a DMA operation between the host device and the controller 12. The host DMA circuit 240 may perform an operation of storing data input from a host device through the host interface 201 in the buffer memory 220 during a program operation under control of a host controller. Also, the host DMA circuit 240 may perform an operation of outputting data stored in the buffer memory 220 to a host device through the host interface 201 during a read operation. In an example embodiment, the host DMA circuit 240 may be implemented to be included in the host controller as a component of the host controller.

The nonvolatile memory DMA circuit 250 may be implemented to control a DMA operation between the controller 12 and the nonvolatile memory device 100. The nonvolatile memory DMA circuit 250 may perform an operation of outputting data stored in the buffer memory 220 to a nonvolatile memory device through the nonvolatile memory interface circuit 202 during a program operation under control of a nonvolatile memory controller. Also, the nonvolatile memory DMA circuit 250 may perform an operation of reading data stored in a nonvolatile memory device through the nonvolatile memory interface circuit 202 during a read operation.

Figure 17:
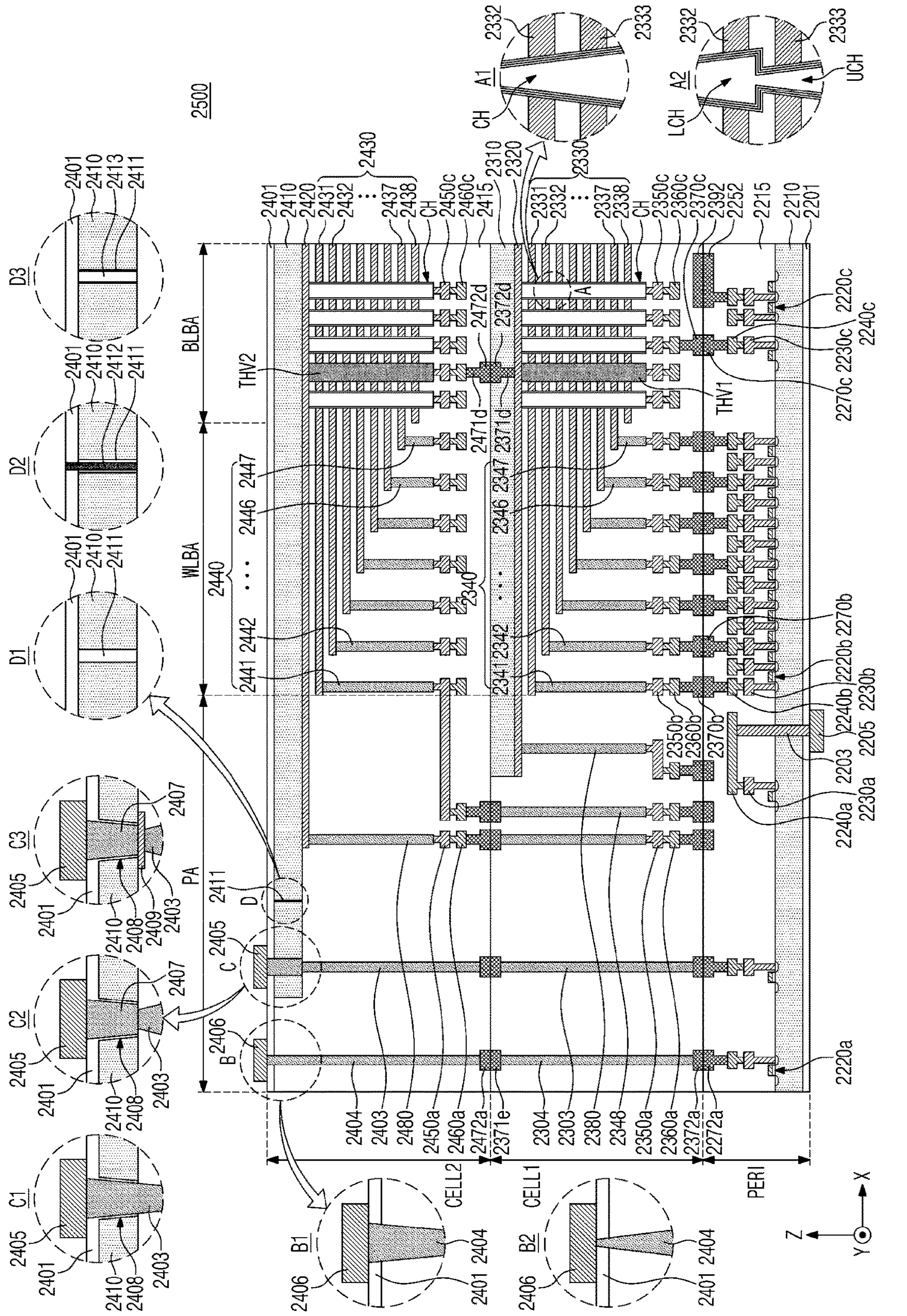
FIG. 17 is a diagram illustrating a vertical nonvolatile memory device according to an example embodiment of the present disclosure.

A nonvolatile memory device according to an example embodiment may be implemented as a vertical memory device. For example, FIG. 17 is a diagram illustrating a vertical nonvolatile memory device according to an example embodiment. Referring to FIG. 17, a nonvolatile memory device 2500 may have a C2C chip to chip structure. Here, the C2C structure may include manufacturing at least one upper chip including a cell region CELL and a lower chip including a peripheral circuit region PERI, respectively, and connecting at least one upper chip and lower chip to each other by bonding. In an example embodiment, the bonding method may refer to a method of electrically or physically connecting the bonding metal pattern formed on the uppermost metal layer of the upper chip to the bonding metal pattern formed on the uppermost metal layer of the lower chip. For example, when the bonding metal patterns are formed of copper (Cu), the bonding method may be a Cu—Cu bonding method. In another example embodiment, bonding metal patterns may also be formed of aluminum (Al) or tungsten (W).

The nonvolatile memory device 2500 may include at least one upper chip including a cell region. For example, as illustrated in FIG. 17, a nonvolatile memory device 2500 may be implemented to include two upper chips. However, this is merely an example, and the number of upper chips is not limited thereto. When the nonvolatile memory device 2500 is implemented to include two upper chips, the nonvolatile memory device 2500 may be manufactured by manufacturing a first upper chip including a first cell region CELL1, a second upper chip including a second cell region CELL2 and a lower chip including a peripheral circuit region PERI, respectively, and connecting the first upper chip, the second upper chip and the lower chip to each other by bonding. The first upper chip may be inverted and connected to the lower chip by bonding, and the second upper chip may also be inverted and connected to the first upper chip by bonding. In the description below, the upper portion and the lower portion of the first and second upper chips may be defined with respect to the state before the first upper chip and the second upper chip are inverted. That is, in FIG. 17, the upper portion of the lower chip may refer to the upper portion defined in the +Z-axis direction, and the upper portion of each of the first and second upper chips may refer to the upper portion defined in the −Z-axis direction. However, this is merely an example, and only one of the first upper chip and the second upper chip may be inverted and connected to each other by bonding.

Each of the peripheral circuit region PERI and the first and second cell regions CELL1 and CELL2 of the nonvolatile memory device 2500 may include an external pad bonding region PA, a wordline bonding region WLBA, and a bitline bonding region BLBA.

The peripheral circuit region PERI may include a first board 2210 and a plurality of circuit devices 2220*a*, 2220*b*, and 2220*c* formed on the first board 2210. An interlayer insulating layer 2215 including one or more insulating layers may be provided on the plurality of circuit devices 2220*a*, 2220*b*, and 2220*c*, and a plurality of metal wirings may be provided in the interlayer insulating layer 2215 to connect the plurality of circuit devices 2220*a*, 2220*b*, and 2220*c*. For example, the plurality of metal wirings may include first metal wirings 2230*a*, 2230*b*, and 2230*c* connected to a plurality of circuit devices 2220*a*, 2220*b*, and 2220*c*, and second metal wirings 2240*a*, 2240*b*, and 2240*c* formed on first metal wirings 2230*a*, 2230*b*, and 2230*c*. The plurality of metal wirings may be formed of at least one of various conductive materials. For example, the first metal wirings 2230*a*, 2230*b*, and 2230*c* may be formed of tungsten having relatively high electrical resistivity, and the second metal wirings 2240*a*, 2240*b*, and 2240*c* may be formed of copper having relatively low electrical resistivity.

Here, only the first metal wiring 2230*a*, 2230*b*, and 2230*c* and the second metal wiring 2240*a*, 2240*b*, and 2240*c* are described, but an example embodiment thereof is not limited thereto, and at least one additional metal wiring may be further formed on the second metal wirings 2240*a*, 2240*b*, and 2240*c*. In this case, the second metal wirings 2240*a*, 2240*b*, and 2240*c* may be formed of aluminum. Also, at least a portion of the additional metal wiring formed on the second metal wirings 2240*a*, 2240*b*, and 2240*c* may be formed of copper having lower electrical resistivity than that of aluminum of the second metal wirings 2240*a*, 2240*b*, and 2240*c*.

The interlayer insulating layer 2215 may be disposed on the first board 2210 and may include an insulating material such as silicon oxide or silicon nitride.

Each of the first and second cell regions CELL1 and CELL2 may include at least one memory block. The first cell region CELL1 may include a second board 2310 and a common source line 2320. On the second board 2310, a plurality of wordlines 2331 to 2338 (2330) may be stacked in the direction (Z-axis direction) perpendicular to the upper surface of the second board 2310. String selection lines and ground selection lines may be disposed above and below the wordlines 2330, and a plurality of wordlines 2330 may be disposed between the string selection lines and the ground selection line. Similarly, the second cell region CELL2 may include a third board 2410 and a common source line (2420), and a plurality of wordlines 2431 to 2438 (2430) may be stacked in a direction (Z-axis direction) perpendicular to the upper surface of the third board 2410. The second board 2310 and the third board 2410 may be formed of various materials, for example, a board having a single crystal epitaxial layer grown on a silicon board, a silicon-a germanium board, a germanium board, or a monocrystalline silicon board. A plurality of channel structures CHs may be formed in each of the first and second cell regions CELL1 and CELL2.

As illustrated in an example embodiment, A1, the channel structure CH may be provided in the bitline bonding region BLBA, may extend in a direction perpendicular to the upper surface of the second board 2310 and may penetrate through the wordlines 2330, string selection lines, and ground selection lines. The channel structure CH may include a data storage layer, a channel layer, and a buried insulating layer. The channel layer may be electrically connected to the first metal wiring 2350*c* and the second metal wiring 2360*c* in a bitline bonding region BLBA. For example, the second metal wiring 2360*c* may be a bitline and may be connected to the channel structure CH through the first metal wiring 2350*c*. The bitline 2360*c* may extend in a first direction (Y-axis direction) parallel to the upper surface of the second board 2310.

In an example embodiment, as illustrated in A2, the channel structure CH may include a lower channel LCH and an upper channel UCH connected to each other. For example, the channel structure CH may be formed through a process for a lower channel LCH and a process for an upper channel UCH. The lower channel LCH may extend in a direction perpendicular to the upper surface of the second board 2310 and may penetrate through the common source line 2320 and the lower wordlines 2331 and 2332. The lower channel LCH may include a data storage layer, a channel layer and a buried insulating layer, and may be connected to an upper channel UCH. The upper channel UCH may penetrate through upper wordlines 2333-2338. The upper channel UCH may include a data storage layer, a channel layer and a buried insulating layer, and the channel layer of the upper channel UCH may be electrically connected to the first metal wiring 2350*c* and the second metal wiring 2360*c*. As the length of the channel increases, it may be difficult to form a channel having a constant width due to reasons related to processes. The nonvolatile memory device 2500 according to the example embodiment may include a channel having improved width uniformity through a lower channel LCH and an upper channel UCH formed through sequential processes.

As illustrated in A2, when the channel structure CH is formed to include a lower channel LCH and an upper channel UCH, a wordline disposed neighboring to the boundary of the lower channel LCH and the upper channel UCH may be a dummy wordline. For example, the wordline 2332 and the wordline 2333 forming the boundary between the lower channel LCH and the upper channel UCH may be dummy wordlines. In this case, data may not be stored in the memory cells connected to the dummy wordline. Alternatively, the number of pages corresponding to memory cells connected to a dummy wordline may be less than the number of pages corresponding to memory cells connected to a general wordline. The voltage level applied to the dummy wordline may be different from the voltage level applied to the general wordline, and accordingly, the effect of the non-uniform channel width between the lower channel LCH and the upper channel UCH on the operation of the memory device may be reduced.

Meanwhile, in A2, the number of lower wordlines 2331 and 2332 through which the lower channel LCH penetrates may be less than the number of upper wordlines 2333-2338 through which the upper channel UCH penetrates. However, this is merely an example, and an example embodiment thereof is not limited thereto. In another example embodiment, the number of lower wordlines penetrating through the lower channel LCH may be equal to or greater than the number of upper wordlines penetrating through the upper channel UCH. Also, the structure and connection relationship of the channel structure CH disposed in the first cell region CELL1 described above may be applied to the channel structure CH disposed in the second cell region CELL2.

In the bitline bonding region BLBA, a first through-electrode THV1 may be provided in a first cell region CELL1, and a second through-electrode THV2 may be provided in a second cell region CELL2. As illustrated in FIG. 9, a first through-electrode THV1 may penetrate through a common source line 2320 and a plurality of wordlines 2330. However, this is merely an example, and the first through-electrode THV1 may further penetrate through the second board 2310. The first through-electrode THV1 may include a conductive material. Alternatively, the first through-electrode THV1 may include a conductive material surrounded by an insulating material. The second through-electrode THV2 may also be provided in the same form and structure as those of the first through-electrode THV1.

In an example embodiment, the first through-electrode THV1 and the second through-electrode THV2 may be electrically connected through a first through-metal pattern 2372*d* and a second through-metal pattern 2472*d*. The first through-metal pattern 2372*d* may be formed on the lower end of the first upper chip including the first cell region CELL1, and the second through-metal pattern 2472*d* may be formed on the upper end of the second upper chip including the second cell region CELL2. The first through-electrode THV1 may be electrically connected to the first metal wiring 2350*c* and the second metal wiring 2360*c*. A lower via 2371*d* may be formed between the first through-electrode THV1 and the first through-metal pattern 2372*d*, and an upper via 2471*d* may be formed between the second through-electrode THV2 and the second through-metal pattern 2472*d*. The first through-metal pattern 2372*d* and the second through-metal pattern 2472*d* may be connected to each other by bonding.

Also, in the bitline bonding region BLBA, an upper metal pattern 2252 may be formed on the uppermost metal layer of the peripheral circuit region PERI, and an upper metal pattern 2392 having the same shape as that of the upper metal pattern 2252 may be formed in the uppermost metal layer of the first cell region CELL1. The upper metal pattern 2392 of the first cell region CELL1 and the upper metal pattern 2252 of the peripheral circuit region PERI may be electrically connected to each other by bonding. In the bitline bonding region BLBA, the bitline 2360*c* may be electrically connected to a page buffer included in the peripheral circuit region PERI. For example, a portion of the circuit devices 2220*c* of the peripheral circuit region PERI may provide a page buffer, and the bitline 2360*c* may be electrically connected to circuit devices 2220*c* providing a page buffer through the upper bonding metal 2370*c* of the first cell region CELL1 and the upper bonding metal 2270*c* of the peripheral circuit region PERI.

In an example embodiment, a page buffer may be implemented to perform a tri-state latch operation as described in FIGS. 1 to 16. Although not illustrated in FIG. 17, a page buffer controller (see 152 in FIG. 1) for controlling the page buffer described in FIGS. 1 to 16 may be further disposed in the bitline bonding region BLBA. For example, the page buffer controller may control each of the page buffers based on different control timings.

Referring to FIG. 17, in the wordline bonding region WLBA, the wordlines 2330 of the first cell region CELL1 may extend in a second direction (X-axis direction) parallel to the upper surface of the second board 2310 and may be connected to a plurality of cell contact plugs 340 (2341-347). A first metal wiring 2350*b* and a second metal wiring 2360*b* may be connected in sequence to an upper portion of the cell contact plugs 2340 connected to the wordlines 2330. The cell contact plugs 2340 may be connected to the peripheral circuit region PERI through the upper bonding metal 2370*b* of the first cell region CELL1 and the upper bonding metal 2270*b* of the peripheral circuit region PERI in the wordline bonding region WLBA.

The cell contact plugs 2340 may be electrically connected to a row decoder included in a peripheral circuit region PERI. For example, a portion of the circuit devices 2220*b* of the peripheral circuit region PERI may provide a row decoder, and the cell contact plugs 2340 may be electrically connected to the circuit devices 2220*b* providing the row decoder through the upper bonding metal 2370*b* of the first cell region CELL1 and the upper bonding metal 2270*b* of the peripheral circuit region PERI. In an example embodiment, an operation voltage of the circuit devices 2220*b* providing a row decoder may be different from an operation voltage of the circuit devices 2220*c* providing a page buffer. For example, an operation voltage of the circuit devices 2220*c* providing a page buffer may be higher than an operation voltage of the circuit devices 2220*b* providing a row decoder.

Similarly, in the wordline bonding region WLBA, the wordlines 2430 of the second cell region CELL2 may extend in the second direction (X-axis direction) parallel to the upper surface of the third board 2410, and may be connected to a plurality of cell contact plugs 2440 (2441-2447). The cell contact plugs 2440 may be connected to the peripheral circuit region PERI through an upper metal pattern of the second cell region CELL2, a lower metal pattern and an upper metal pattern of the first cell region CELL1, and a cell contact plug (2348).

In the wordline bonding region WLBA, an upper bonding metal 2370*b* may be formed in a first cell region CELL1, and an upper bonding metal 2270*b* may be formed in a peripheral circuit region PERI. The upper bonding metal 2370*b* of the first cell region CELL1 and the upper bonding metal 2270*b* of the peripheral circuit region PERI may be electrically connected to each other by bonding. The upper bonding metal 2370*b* and the upper bonding metal 2270*b* may be formed of aluminum, copper, or tungsten.

In the external pad bonding region PA, a lower metal pattern 2371*e* may be formed in the lower portion of the first cell region CELL1, and an upper metal pattern (2472*a*) may be formed in the upper portion of the second cell region CELL2. The lower metal pattern 2371*e* of the first cell region CELL1 and the upper metal pattern 2472*a* of the second cell region CELL2 may be connected to each other by bonding in the external pad bonding region PA. Similarly, an upper metal pattern 2372*a* may be formed on the first cell region CELL1, and an upper metal pattern 2272*a* may be formed on the peripheral circuit region PERI. The upper metal pattern 2372*a* of the first cell region CELL1 and the upper metal pattern 2272*a* of the peripheral circuit region PERI may be connected to each other by bonding.

Common source line contact plugs 2380 and 2480 may be disposed in the external pad bonding region PA. The common source line contact plugs 2380 and 2480 may be formed of a conductive material such as metal, metal compound, or doped polysilicon. The common source line contact plug 2380 of the first cell region CELL1 may be electrically connected to the common source line 2320, and the common source line contact plug 2480 of the second cell region CELL2 may be electrically connected to the common source line 2420. A first metal wiring 2350*a* and a second metal wiring (2360*a*) may be stacked in sequence on the common source line contact plug 2380 of the first cell region CELL1, and a first metal wiring 2450*a* and a second metal wiring 2460*a* may be stacked in sequence on the common source line contact plug 2480 of the second cell region CELL2.

The input/output pads 2205, 2405, and 2406 may be disposed in the external pad bonding region PA. Referring to FIG. 14, a lower insulating film 2201 may cover the lower surface of the first board 2210, and a first input/output pad 2205 may be formed on the lower insulating film 2201. The first input/output pad 2205 may be connected to at least one of the plurality of circuit devices 2220*a* disposed in the peripheral circuit region PERI through the first input/output contact plug 2203 and may be isolated from the first board 2210 by a lower insulating film 2201. Also, a side insulating film may be disposed between the first input/output contact plug 2203 and the first board 2210 and may electrically isolate the first input/output contact plug 2203 and the first board 2210 from each other.

An upper insulating film 2401 covering an upper surface of the third board 2410 may be formed above the third board 2410. A second input/output pad 2405 or a third input/output pad 2406 may be disposed on the upper insulating film 2401. The second input/output pad 2405 may be connected to at least one of a plurality of circuit devices 2220*a* disposed in the peripheral circuit region PERI through the second input/output contact plugs 2403 and 2303, and the third input/output pad 2406 may be connected to at least one of the plurality of circuit devices 2220*a* arranged in the peripheral circuit region PERI through the third input/output contact plugs 2404 and 2304.

In an example embodiment, the third board 2410 may not be disposed in a region in which an input/output contact plug is disposed. For example, as illustrated in B, the third input/output contact plug 2404 may be isolated from the third board 2410 in a direction parallel to the upper surface of the third board 2410, and may penetrate through the interlayer insulating layer 2415 of the second cell region CELL2 and may be connected to the third input/output pad 2406. In this case, the third input/output contact plug 2404 may be formed through various processes.

For example, as illustrated in B1, the third input/output contact plug 2404 may extend in the third direction (Z-axis direction) and may have a diameter increasing toward the upper insulating film 2401. That is, while the diameter of the channel structure CH described in A1 is formed to decrease toward the upper insulating film 2401, the diameter of the third input/output contact plug 2404 may increase toward the upper insulating film 2401. For example, the third input/output contact plug 2404 may be formed after the second cell region CELL2 and the first cell region CELL1 are bonded to each other.

Also, as an example, as illustrated in B2, the third input/output contact plug 2404 may extend in the third direction (Z-axis direction) and may have a diameter decreasing toward the upper insulating film 2401. That is, the diameter of the third input/output contact plug 2404 may decrease toward the upper insulating film 2401 similarly to the channel structure CH. For example, the third input/output contact plug 2404 may be formed together with the cell contact plugs 2440 before the second cell region CELL2 and the first cell region CELL1 are bonded to each other.

In another example embodiment, an input/output contact plug may be disposed to overlap the third board 2410. For example, as illustrated in C, the second input/output contact plug 2403 may be formed by penetrating through the interlayer insulating layer 2415 of the second cell region CELL2 in the third direction (Z-axis direction), and may be electrically connected to the second input/output pad 2405 through the third board 2410. In this case, the connection structure of the second input/output contact plug 2403 and the second input/output pad 2405 may be implemented in various manners.

For example, as illustrated in C1, an opening 2408 penetrating through the third board 2410 may be formed, and the second input/output contact plug 2403 may be directly connected to the second input/output pad 2405 through an opening 2408 formed in the third board 2410. In this case, as illustrated in C1, the diameter of the second input/output contact plug 2403 may increase toward the second input/output pad 2405. However, this is merely an example, and the diameter of the second input/output contact plug 2403 may decrease toward the second input/output pad 2405.

For example, as illustrated in C2, an opening 2408 penetrating through the third board 2410 may be formed, and a contact 2407 may be formed in the opening 2408. One end of the contact 2407 may be connected to the second input/output pad 2405, and the other end may be connected to the second input/output contact plug 2403. Accordingly, the second input/output contact plug 2403 may be electrically connected to the second input/output pad 2405 through the contact 2407 in the opening 2408. In this case, as illustrated in C2, the diameter of the contact 2407 may increase toward the second input/output pad 2405, and the diameter of the second input/output contact plug 2403 may decrease toward the second input/output pad 2405. For example, the third input/output contact plug 2403 may be formed together with the cell contact plugs 2440 before the second cell region CELL2 and the first cell region CELL1 are bonded to each other, and the contact 2407 may be formed after the second cell region CELL2 and the first cell region CELL1 are bonded to each other.

Also, as an example, as illustrated in C3, a stopper 2409 may be further formed on the upper surface of the opening 2408 of the third board 2410 as compared to C2. The stopper 2409 may be metal wiring formed on the same layer as the common source line 2420. However, this is merely an example, and the stopper 2409 may be metal wiring formed on the same layer as at least one of the wordlines 2430. The second input/output contact plug 2403 may be electrically connected to the second input/output pad 2405 through the contact 2407 and the stopper 2409.

Similar to the second and third input/output contact plugs 2403 and 2404 of the second cell region CELL2, the second and third input/output contact plugs 2303 and 2304 of the first cell region CELL1 may have a diameter decreasing toward the lower metal pattern 2371*e* or a diameter increasing toward the lower metal pattern 2371*e*, respectively.

In example embodiments, a slit 2411 may be formed on the third board 2410. For example, the slit 2411 may be formed in an arbitrary position of the external pad bonding region PA. In an example embodiment, as illustrated D, the slit 2411 may be disposed between the second input/output pad 2405 and the cell contact plugs 2440 when viewed from a plane. However, this is merely an example, and the slit 2411 may be formed such that the second input/output pad 2405 may be disposed between the slit 2411 and the cell contact plugs 2440 when viewed from a plane.

For example, as illustrated in D1, the slit 2411 may be formed to penetrate through the third board 2410. The slit 2411 may be used to prevent the third board 2410 from being finely split when the opening 2408 is formed. However, this is merely an example, and the slit 2411 may be formed to a depth of about 60-70% of the thickness of the third board 2410.

Also, as an example, as illustrated in D2, a conductive material 2412 may be formed in the slit 2411. The conductive material 2412 may be used, for example, to discharge leakage current generated during driving of circuit devices in an external pad bonding region PA. In this case, the conductive material 2412 may be connected to an external ground line.

As an example, as illustrated in D3, an insulating material 2413 may be formed in the slit 2411. The insulating material 2413 may electrically isolate the second input/output pad 2405 and the second input/output contact plug 2403 disposed in the external pad bonding region PA from the wordline bonding region WLBA, for example. By forming the insulating material 2413 in the slit 2411, the voltage provided through the second input/output pad 2405 may be prevented from affecting the metal layer disposed on the third board 2410 in the wordline bonding region WLBA.

In example embodiments, first to third input/output pads 2205, 405, and 406 may be selectively formed. For example, the nonvolatile memory device 2500 may include only the first input/output pad 2205 disposed above the first board 2201, may include only the second input/output pad 2405 disposed above the third board 2410, or may include only the third input/output pad 2406 disposed above the upper insulating film 2401.

In example embodiments, at least one of the second board 2310 of the first cell region CELL1 and the third board 2410 of the second cell region CELL2 may be used as a sacrificial board, and may be completely or partially removed before or after the bonding process. An additional film may be deposited after removing the board. For example, the second board 2310 of the first cell region CELL1 may be removed before or after bonding between the peripheral circuit region PERI and the first cell region CELL1, and an insulating film covering the upper surface of the common source line 2320 or a conductive film for connection may be formed. Similarly, the third board 2410 of the second cell region CELL2 may be removed before or after bonding between the first cell region CELL1 and the second cell region CELL2, and an upper insulating film 2401 covering the upper surface of the common source line 2420 or a conductive film for connection may be formed.

In a general nonvolatile memory device, a long dump time during a dump sequence operation can result in a programming overhead, referred to as tPROG. Overhead. In a standard dump sequence, within a page buffer circuit where the sensing portion and the DT portion are isolated from each other, an AND calculation of two latch data may be performed while sequentially reflecting each latch data onto the DT portion. Since the latches are connected to the same DT portion, if reflected simultaneously, the two latches might electrically connect with the DT portion in-between, possibly damaging the existing latch data. Therefore, when two data are being AND computed, "period 1," where the first latch data is reflected in the DT portion, and "period 2," where the second latch data is reflected in the DT portion, might need to be executed sequentially. In this scenario, the dump time could be extended, leading to tPROG. Overhead. The dump time might increase arithmetically according to the number of latches. For instance, if three latches are performing AND operation, it could extend to "period 3". A nonvolatile memory device according to an example embodiment may use Tri-State Tr. to reduce data dump time while preventing damage to latch data. When using this method, latches for performing AND operation may be connected to the DT portion simultaneously to reflect the latch value, such that AND operation of latches may be performed simultaneously. Accordingly, the issues in which the dump time increases arithmetically may be addressed by sequentially reflecting the latch value, differently from the general method.

While both latches are connected to the DT portion simultaneously, the Tri-State Tr. connected to the power terminal VDD of the inverter included in the latch may be turned off. Accordingly, a current may not flow from VDD even when the DT portion and two latches are connected simultaneously. Accordingly, the latch value on the side which is not connected to the DT portion may not be connected to VDD since Tri-State Tr. PMOS is turned off even when the opposite latch value is damaged (1→0). Accordingly, the opposite latch may be completely unaffected and may preserve the value completely. Even when the data is damaged by performing the AND operation at once, the data may be restored, so the dump sequence time may not increase even when the number of AND operations increases.

A nonvolatile memory device according to an example embodiment may include a BL portion, a discharge portion, a sensing portion, and a data transfer portion (DT portion) to internally perform data computation in a circuit for the purpose of sensing.

A dump sequence of a nonvolatile memory device according to an example embodiment may include performing circuit initialization precharging, performing computation by simultaneously reflecting a latch value to a DT portion, and perform sensing. In this case, data may be restored using the Tri-State Latch. In an example embodiment, the values of Latch 1 and Latch 2 may be simultaneously reflected on the DT portion. In an example embodiment, data recovery time may be added, but data may be restored in a unit time through Tri-state latch control. In an example embodiment, data may be restored even when the latch data is damaged because the data is restored with a Tri-State latch. In an example embodiment, period 1 and 2 may be computed simultaneously, such that the computation time may be reduced.

In the example embodiment, there may be a "DT node" to which a plurality of latches capable of tri-state control are connected, and in the structure in which both nodes are connected using 'Calib. Tr.,' the SO node may be directly discharged to the Latch's ground terminal GND through Calib. Tr. And accordingly, data of latch may be reflected on the SO node such that the general page buffer operation method such as sensing and data dump may be performed. The exemplary embodiment may allow the simultaneous connection of multiple latches during the process of discharging the SO node to the ground terminal GND of the latch. This occurs within a latch structure that includes two pairs of inverters equipped with a tri-state Tr. In such a case, a method may be proposed that restores damaged latch data based on the latch data from the undamaged side. This is achieved by sequentially adjusting the timing of activating the Tri-State in the latch, even when a portion of the latch data is damaged. In the exemplary embodiment, the Tri-State Tr. may be utilized to decrease the data dump time while preventing latch data damage. When employing this method, latches used for performing AND operation may be simultaneously connected to the DT portion, and the latch value can be reflected. As a result, the AND operation of latches may occur simultaneously. Accordingly, the problem of an arithmetically increasing dump time caused by sequentially reflecting the latch value in the conventional method may be addressed.

Additionally, while both latches are simultaneously connected to the DT portion, a Tri-State Tr. that's connected to the VDD of an inverter included in the latch may be turned off. As a result, a current might not flow from the power terminal VDD even when the DT portion and two latches are connected simultaneously. Therefore, the latch value on the side not connected to the DT portion may remain unconnected to VDD even if the opposite latch value is damaged (1→0), as the Tri-State Tr. PMOS located above the latch is switched off. Consequently, the opposite latch may remain entirely unaffected, preserving its value completely.

According to the example embodiments, using the nonvolatile memory device, the storage device including the same, and the method of operating the same, a voltage of the sensing node may be discharged to the ground terminal of the latch. Also, using the nonvolatile memory device, the storage device including the same, and the method of operating the same, a dump sequence operation of simultaneously reflecting the value of the first latch and the value of the second latch in the page buffer to the sensing node may be performed. Also, using the nonvolatile memory device, the storage device including the same, and the method of operating the same, during the dump sequence operation, damaged data may be restored using the tri-state latch.

While the example embodiments have been illustrated and described above, it will be configured as apparent to those skilled in the art that modifications and variations may be made without departing from the scope in the example embodiment as defined by the appended claims.

What is claimed is:

1. A nonvolatile memory device, comprising:
- a plurality of tri-state latches;
- a sensing node circuit configured to electrically couple a sensing node therein to a bitline of the memory device;
- a transfer node circuit configured to electrically couple a transfer node therein to the plurality of tri-state latches; and
- a node connection circuit configured to electrically connect the transfer node to the sensing node; and
- wherein the transfer node circuit and the node connection circuit are collectively configured to simultaneously reflect data stored in at least two of the plurality of tri-state latches to the sensing node, in response to a dump sequence operation.

2. The nonvolatile memory device of claim 1, further comprising:
- a page buffer controller configured to restore the data using inversion data of at least one tri-state latch when data of the at least one tri-state latch is damaged during the dump sequence operation.

3. The nonvolatile memory device of claim 1, wherein each of the plurality of tri-state latches includes:
- a first switch configured to connect the transfer node to a set node in response to a set switch signal;
- a second switch configured to connect the transfer node to a reset node in response to a reset switch signal;
- a first inverter activated in response to a first inverter activation signal and electrically connected between the set node and the reset node; and
- a second inverter activated in response to a second inverter activation signal, electrically connected between the reset node and the set node, and electrically coupled to an output terminal of the first inverter.

4. The nonvolatile memory device of claim 3,
- wherein the first inverter comprises:
  - a first transistor electrically connected to a power terminal in response to the first inverter activation signal;
  - a first PMOS transistor electrically connected between the first transistor and the reset node; and
  - a first NMOS transistor electrically connected between the reset node and a ground terminal;
- wherein the second inverter comprises:
  - a second transistor electrically connected to the power terminal in response to the second inverter activation signal;
  - a second PMOS transistor electrically connected between the second transistor and the set node; and
  - a second NMOS transistor electrically connected between the set node and the ground terminal;
- wherein the first PMOS transistor and the first NMOS transistor have a gate connected to the reset node; and
- wherein the second PMOS transistor and the second NMOS transistor have a gate connected to the set node.

5. The nonvolatile memory device of claim 4, wherein each of the plurality of tri-state latches is configured so that data stored therein is restored by turning on the corresponding first transistor and the corresponding second transistor in sequence.

6. The nonvolatile memory device of claim 1, wherein the node connection circuit comprises:
- a monitor transistor configured to monitor the transfer node in response to a monitoring signal;
- a sense transistor configured to sense the sensing node in response to a sense signal; and
- a calibration transistor configured to connect the transfer node to the sensing node in response to a calibration signal.

7. The nonvolatile memory device of claim 1,
- wherein the sensing node circuit includes a sensing node precharge circuit configured to precharge the sensing node; and
- wherein the transfer node circuit includes a transfer node precharge circuit configured to precharge the transfer node.

8. The nonvolatile memory device of claim 6, wherein the calibration transistor is turned on during the dump sequence operation.

9. The nonvolatile memory device of claim 6, wherein, by turning on the sense transistor, data according to a result of the dump sequence operation is stored in one of the plurality of tri-state latches.

10. The nonvolatile memory device of claim 9, wherein, when the data is stored in one of the tri-state latches, each of the at least two tri-state latches is initialized using inversion data.

11. A method of operating a nonvolatile memory device, comprising:

precharging a sensing node and a transfer node; then simultaneously reflecting data of a first tri-state latch and data of a second tri-state latch to the sensing node; then precharging the transfer node; and then sensing data corresponding to the sensing node; and wherein, when data of the first tri-state latch and/or the second tri-state latch is damaged, the data therein is restored using inversion data of the corresponding tri-state latch.

12. The method of claim 11, wherein said precharging the sensing node and the transfer node includes:

precharging the transfer node; and precharging the sensing node by connecting the transfer node to the sensing node.

13. The method of claim 11, wherein, during program operation, data stored in the first tri-state latch is "1" and data stored in the second tri-state latch is "0".

14. The method of claim 11, wherein each of the first tri-state latch and the second tri-state latch includes a first inverter and a second inverter having a tri-state transistor; and wherein the method further includes restoring data by turning on tri-state transistors of the first inverter and the second inverter in sequence.

15. The method of claim 14, wherein the data is restored in unit time.

16. A storage device, comprising:

a nonvolatile memory package having a plurality of nonvolatile memory devices therein; and a controller configured to control the nonvolatile memory package;

wherein each of the plurality of nonvolatile memory devices includes:

a memory cell array having a plurality of memory cells connected between wordlines and bitlines;

a row decoder configured to select one of the wordlines; and page buffers connected to the bitlines;

wherein each of the page buffers includes:

a plurality of latches;

a sensing node circuit having a sensing node connected to the bitline;

a transfer node circuit having a transfer node connected to the plurality of latches; and a node connection circuit configured to connect the sensing node to the transfer node, and wherein each of the page buffers is configured to perform a dump sequence operation, which includes simultaneously reflecting data stored in at least two of the plurality of latches to the sensing node during a program operation.

17. The storage device of claim 16, wherein each of the plurality of latches includes a tri-state latch.

18. The storage device of claim 17, wherein, during the dump sequence operation, at least one damaged data among the at least two latches is restored using a corresponding tri-state latch operation.

19. The storage device of claim 16, wherein the node connection circuit includes a calibration transistor connecting the sensing node to the transfer node.

20. The storage device of claim 19, wherein a voltage of the sensing node is transmitted to at least one of the plurality of latches through the calibration transistor.

* * * * *